US012775136B2

(12) United States Patent
Kunieda

(10) Patent No.: US 12,775,136 B2
(45) Date of Patent: Oct. 27, 2026

(54) WIRING SUBSTRATE HAVING OPTICAL WIRING PART

(71) Applicant: IBIDEN CO., LTD., Ogaki (JP)

(72) Inventor: Masatoshi Kunieda, Ibi-gun (JP)

(73) Assignee: IBIDEN CO., LTD., Ogaki (JP)

(*) Notice: Subject to any disclaimer, the term of this patent is extended or adjusted under 35 U.S.C. 154(b) by 260 days.

(21) Appl. No.: 18/640,293

(22) Filed: Apr. 19, 2024

(65) Prior Publication Data

US 2024/0272355 A1 Aug. 15, 2024

Related U.S. Application Data

(63) Continuation of application No. PCT/JP2022/037845, filed on Oct. 11, 2022.

(30) Foreign Application Priority Data

Oct. 20, 2021 (JP) ................................ 2021-171879

(51) Int. Cl.
*G02B 6/122* (2006.01)
*H10W 70/63* (2026.01)
(Continued)

(52) U.S. Cl.
CPC .......... *G02B 6/122* (2013.01); *H10W 70/635* (2026.01); *H10W 72/01235* (2026.01);
(Continued)

(58) Field of Classification Search
CPC . H10W 70/635; H10W 90/00; H10W 72/012; H10W 72/20; H10W 90/724;
(Continued)

(56) References Cited

U.S. PATENT DOCUMENTS 6,542,685 B1 * 4/2003 Yoneda ................ G02B 6/1203 385/129
10,877,213 B2 * 12/2020 Xie .................... G02B 6/12019
(Continued)

FOREIGN PATENT DOCUMENTS

JP 2001-166165 A 6/2001
JP 2002-359472 A 12/2002
(Continued)

OTHER PUBLICATIONS

International Search Report issued Dec. 20, 2022 in PCT/ JP2022/ 037845, filed Oct. 11, 2022, 6 pages.
(Continued)

*Primary Examiner* — Timothy J Thompson
*Assistant Examiner* — Michael F Mcallister
(74) *Attorney, Agent, or Firm* — Finnegan, Henderson, Farabow, Garrett & Dunner, LLP

(57) ABSTRACT

A wiring substrate includes an electrical wiring part including insulating layers and conductor layers, and an optical wiring part formed on a surface of the electrical wiring part and including a support plate and an optical waveguide formed on the support plate. The optical wiring part is formed such that the optical waveguide includes at least one core part that transmits light and a cladding part surrounding the at least one core part and that the support plate has a thermal expansion coefficient that is lower than a thermal expansion coefficient of the optical waveguide.

20 Claims, 12 Drawing Sheets

(51) Int. Cl.
*H10W 90/00* (2026.01)
*H10W 72/00* (2026.01)
*H10W 72/20* (2026.01)

(52) U.S. Cl.
CPC .... *H10W 72/01257* (2026.01); *H10W 72/252* (2026.01); *H10W 90/00* (2026.01); *H10W 90/724* (2026.01)

(58) Field of Classification Search
CPC ..... H10W 72/01257; H10W 72/01235; H10W 72/252; G02B 6/122; G02B 6/4214; G02B 6/43
USPC .......................................................... 174/250
See application file for complete search history.

(56) References Cited

U.S. PATENT DOCUMENTS

| | | | | |
|---|---|---|---|---|
| 2003/0034554 | A1 | 2/2003 | Onitani et al. | |
| 2005/0163445 | A1* | 7/2005 | Hanashima | G02B 6/132 385/132 |
| 2009/0028497 | A1 | 1/2009 | Kodama et al. | |
| 2013/0223789 | A1 | 8/2013 | Lee et al. | |
| 2016/0245997 | A1* | 8/2016 | Terada | G02B 6/428 |
| 2023/0324611 | A1* | 10/2023 | Shishido | G02B 6/13 385/14 |

FOREIGN PATENT DOCUMENTS

| | | | |
|---|---|---|---|
| JP | WO 2007/111236 | A1 | 10/2007 |
| JP | 2008-129385 | A | 6/2008 |
| JP | 2020-026486 | A | 2/2020 |

OTHER PUBLICATIONS

International Preliminary Report on Patentability and Written Opinion issued May 2, 2024, in PCT/JP2022/037845 (with English Translation), 6 pages.

* cited by examiner

WIRING SUBSTRATE HAVING OPTICAL WIRING PART

CROSS-REFERENCE TO RELATED APPLICATIONS

The present application is a continuation of and claims the benefit of priority to International Application No. PCT/JP2022/037845, filed Oct. 11, 2022, which is based upon and claims the benefit of priority to Japanese Application No. 2021-171879, filed Oct. 20, 2021. The entire contents of these applications are incorporated herein by reference.

BACKGROUND OF THE INVENTION

Field of the Invention

The present invention relates to a wiring substrate.

Description of Background Art

Japanese Patent Application Laid-Open Publication No. 2008-129385 describes an optical component mounting substrate, on a surface of which an optical waveguide is mounted. The entire contents of this publication are incorporated herein by reference.

SUMMARY OF THE INVENTION

According to one aspect of the present invention, a wiring substrate includes an electrical wiring part including insulating layers and conductor layers, and an optical wiring part formed on a surface of the electrical wiring part and including a support plate and an optical waveguide formed on the support plate. The optical wiring part is formed such that the optical waveguide includes at least one core part that transmits light and a cladding part surrounding the at least one core part and that the support plate has a thermal expansion coefficient that is lower than a thermal expansion coefficient of the optical waveguide.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
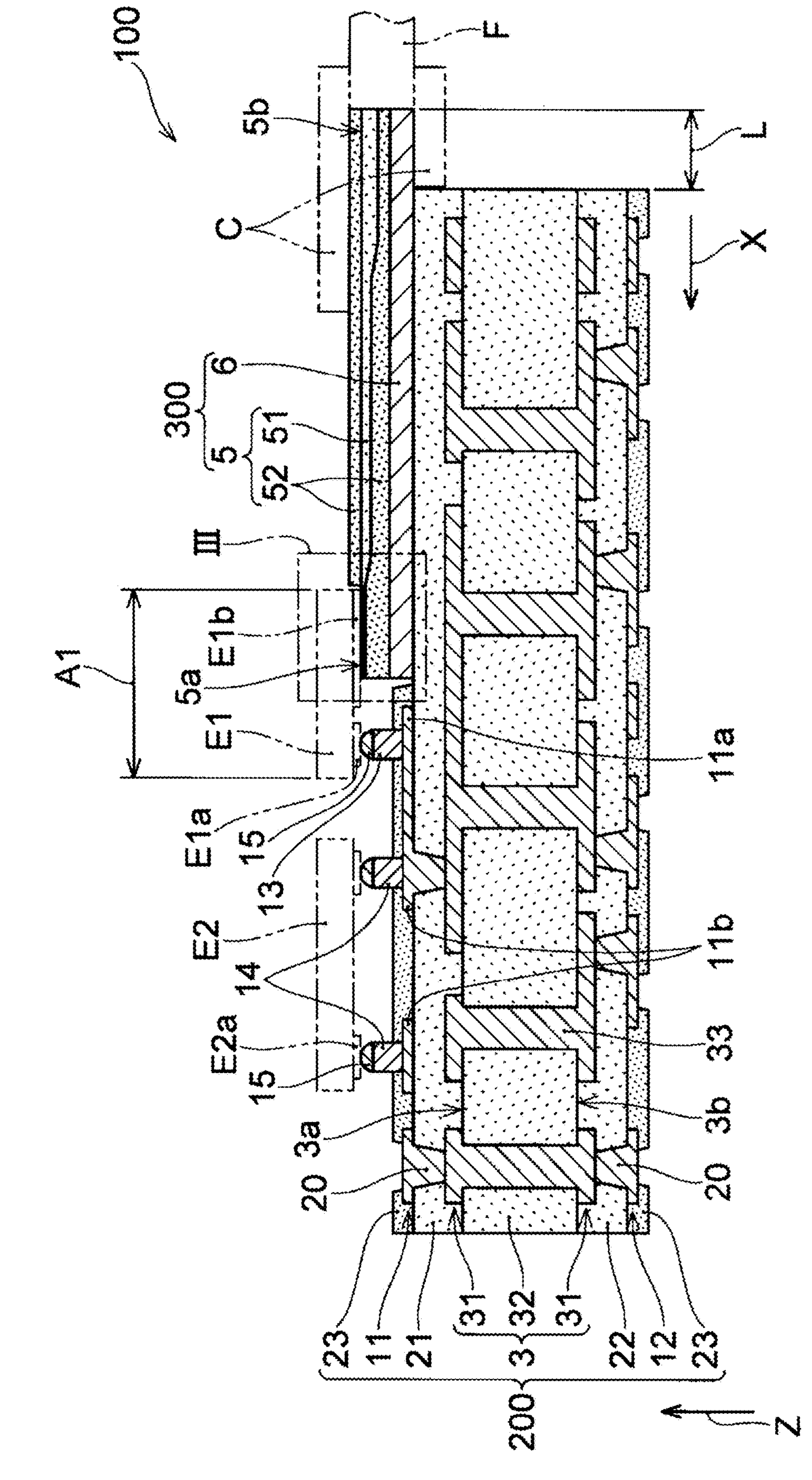
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
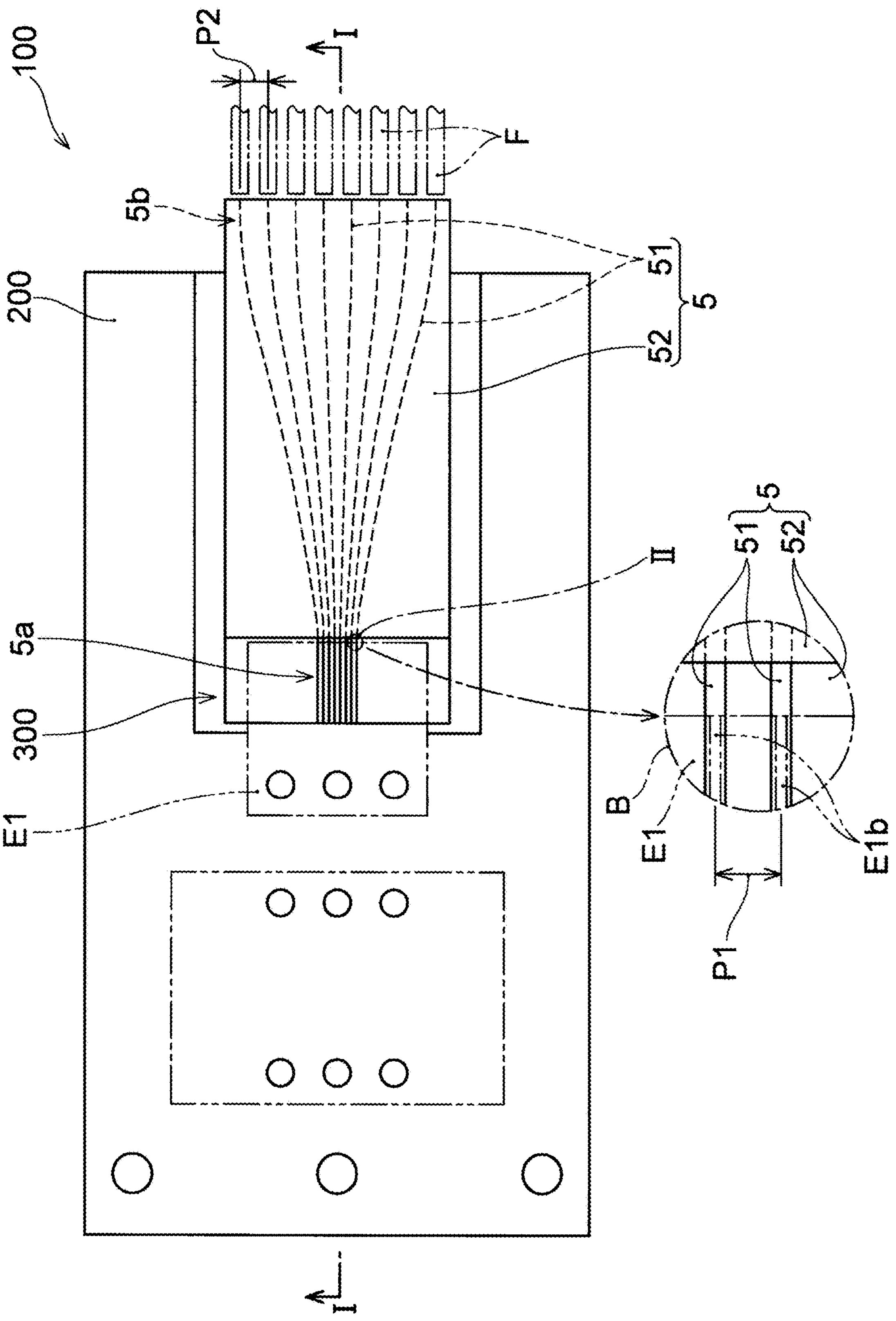
FIG. 2 is a plan view illustrating an example of a plan view of the wiring substrate of FIG. 1.
Figure 3:
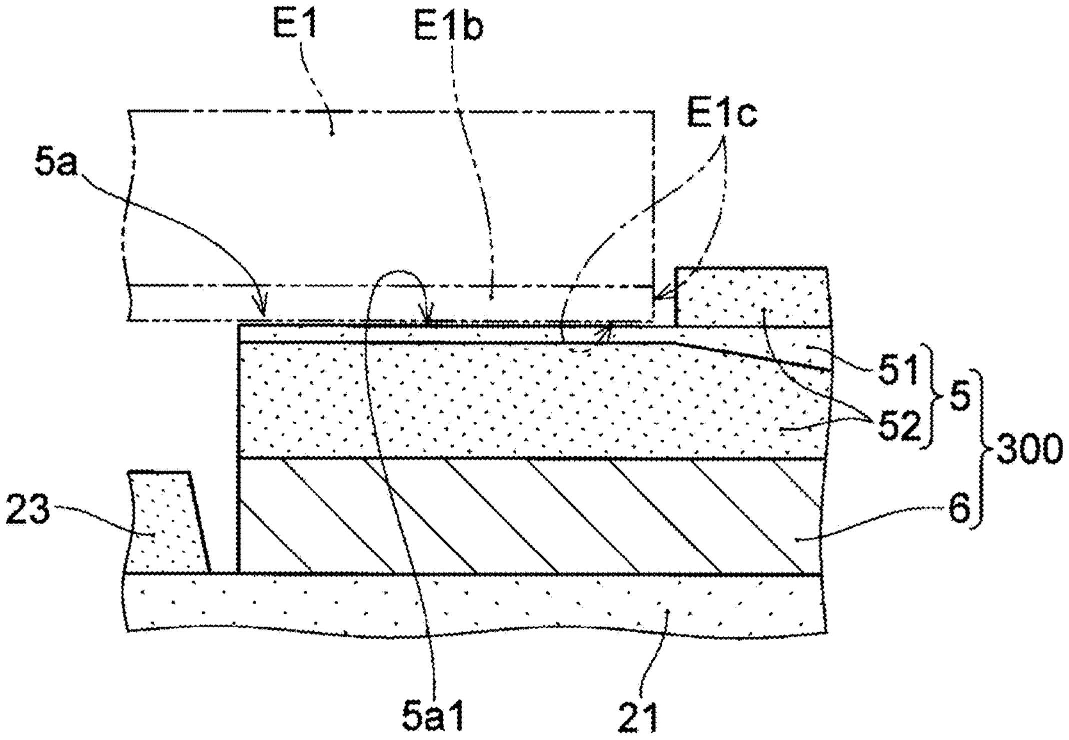
FIG. 3 is an enlarged view of a portion (III) of FIG. 1.

A wiring substrate according to an embodiment of the present invention is described with reference to the drawings. FIG. 1 is a cross-sectional view illustrating a wiring substrate 100, which is an example of a wiring substrate according to an embodiment of the present invention, and FIG. 2 illustrates an example of the wiring substrate 100 of FIG. 1 in a plan view (FIG. 1 is a cross-sectional view along a line (I-I) in FIG. 2). The term "plan view" means viewing the wiring substrate of the embodiment along a thickness direction thereof. An enlarged view of a portion (II) of FIG. 2 is illustrated in a circle (B) depicted using a one-dot chain line in FIG. 2. FIG. 3 illustrates an enlarged view of a portion (III) of FIG. 1. The wiring substrate 100 is merely an example of a wiring substrate according to an embodiment of the present invention. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes an electrical wiring part 200 and an optical wiring part 300 placed on a surface of the electrical wiring part 200. The electrical wiring part 200 includes insulating layers and conductor layers. Specifically, the electrical wiring part 200 in the example of FIG. 1 includes: a core substrate 3 that has a first surface (3*a*) and a second surface (3*b*) opposing each other in a thickness direction thereof; an insulating layer 21 and a conductor layer 11 that are sequentially laminated on the first surface (3*a*) of the core substrate 3; and an insulating layer 22 and a conductor layer 12 that are sequentially laminated on the second surface (3*b*) of the core substrate 3. The core substrate 3 includes an insulating layer 32, and conductor layers 31 that are respectively formed on both sides of the insulating layer 32. The insulating layer 32 is provided with through-hole conductors 33 that penetrate the insulating layer 32 and connects the conductor layers 31 on both sides of the insulating layer 32 to each other.

In the description of the embodiment, a side farther from the insulating layer 32 in a thickness direction of the wiring substrate 100 is also referred to as an "upper side" or simply "upper," and a side closer to the insulating layer 32 is also referred to as a "lower side" or simply "lower." Further, for the conductor layers and the insulating layers, a surface facing the opposite side with respect to the insulating layer 32 is also referred to as an "upper surface," and a surface facing the insulating layer 32 side is also referred to as a "lower surface." The thickness direction of the wiring substrate 100 is also referred to as a "Z direction."

The electrical wiring part 200 further includes a solder resist 23 formed on each of the first surface (3*a*) side and the second surface (3*b*) side of the core substrate 3. The solder resist 23 partially covers the insulating layer 21 and the conductor layer 11, or partially covers the insulating layer 22 and the conductor layer 12. The insulating layer 21 is an interlayer insulating layer interposed between the conductor layer 11 and the conductor layer 31, and the insulating layer 22 is an interlayer insulating layer interposed between the conductor layer 12 and the conductor layer 31. In each of the insulating layer 21 and the insulating layer 22, via conductors 20 connecting the conductor layers that sandwich the insulating layer 21 or the insulating layer 22 to each other are formed.

The electrical wiring part 200 further includes conductor posts (13, 14) formed on the conductor layer 11. A connection layer 15 is formed, for example, using tin-based solder or gold-based solder or the like on surfaces of the conductor posts (13, 14). The conductor posts (13, 14) are each a conductor having, for example, a columnar shape extending from the conductor layer 11 in a direction away from the insulating layer 21. The conductor posts (13, 14) penetrate the solder resist 23 and protrude from a surface of the solder resist 23. An external component (E1) is connected to the conductor posts 13, and an external component (E2) is connected to the conductor posts 14. Therefore, the electrical wiring part 200 has a component mounting region (A1), which is a region where the component (E1) is mounted when the wiring substrate 100 is used. The component mounting region (A1) is covered by the component (E1) when the wiring substrate 100 is used.

The insulating layers (21, 22) and the insulating layer 32 are each formed of, for example, an insulating resin such as an epoxy resin, a bismaleimide triazine resin (BT resin), or a phenol resin. Further, although not illustrated, the insulating layers each may contain a core material (reinforcing material) formed of a glass fiber, an aramid fiber, or the like, and each may contain an inorganic filler formed of fine particles of silica ($SiO_2$), alumina, mullite, or the like. On the other hand, the solder resist 23 is formed of, for example, a photosensitive epoxy resin, a photosensitive polyimide resin, or the like.

The conductor layers (11, 12), the conductor layers 31, the through-hole conductors 33, the via conductors 20, and the conductor posts (13, 14) can be formed using any metal such as copper or nickel. In FIG. 1, these conductors are simplified and depicted as each having a one-layer structure. However, these conductors can each have a multilayer structure including two or more film bodies. For example, the conductor layers (11, 12) can each have a two-layer structure including an electroless plating film and an electrolytic plating film. The conductor posts (13, 14) are formed of, for example, plating metal deposited by electroless plating and/or electrolytic plating.

The conductor layers (11, 12) and the conductor layers 31 can each include any conductor patterns. In the example of FIG. 1, the conductor layer 11 includes conductor pads (11*a*, 11*b*). The conductor posts 13 are formed on the conductor pads (11*a*), and electrodes (E1*a*) of the component (E1) are electrically connected to the conductor pads (11*a*) via the conductor posts 13. Similarly, the conductor posts 14 are formed on the conductor pads (11*b*), and electrodes (E2*a*) of the component (E2) are electrically connected to the conductor pads (11*b*) via the conductor posts 14.

When the wiring substrate 100 is used, an electrical component that includes a light receiving element and/or a light emitting element and has a photoelectric conversion function is mounted in the component mounting region (A1) as the component (E1). The component (E1) in the example of FIGS. 1-3 includes a light receiving or light emitting part (E1*b*) in addition to the electrodes (E1*a*). The light receiving or light emitting part (E1*b*) has a light receiving or light emitting surface (E1*c*) (see FIG. 3) facing sideways and downward from the component (E1). The electrodes (E1*a*) and the light receiving or light emitting part (E1*b*) are provided on a surface of the component (E1) facing the wiring substrate 100 side. That is, in the example of FIGS. 1-3, the component (E1) is mounted by so-called face-down mounting (flip-chip mounting).

Examples of the component (E1) include light receiving elements such as a photodiode, and light emitting elements such as a light emitting diode (LED), an organic light emitting diode (OLED), a laser diode (LD), and a vertical cavity surface emitting laser (VCSEL). When the component (E1) is a light emitting element, the component (E1) generates light based on an electrical signal input to the electrodes (E1*a*) and emits light from the light receiving or light emitting part (E1*b*) that functions as a light emitting part. Further, when the component (E1) is a light receiving element, an electrical signal is generated based on light incident on the light receiving or light emitting part (E1*b*) that functions as a light receiving part, and is output from the electrodes (E1*a*).

The component (E2) can be, for example, an electronic component such as a semiconductor device that generates an electrical signal that causes the component (E1) to emit light, and/or processes an electrical signal generated by the component (E1). Examples of the component (E2) include semiconductor devices such as a general-purpose operational amplifier, a driver IC, a microcomputer, and a programmable logic device (PLD).

In the wiring substrate 100 in the example of FIG. 1, the optical wiring part 300 is formed on a portion of the insulating layer 21 that is exposed on the surface of the electrical wiring part 200. That is, the optical wiring part 300 is formed in a portion of the insulating layer 21 where the conductor layer 11 and the solder resist 23 are not formed.

The optical wiring part 300 includes an optical waveguide 5 and a support plate 6. The support plate 6 is positioned on the electrical wiring part 200. The optical waveguide 5 is formed on the support plate 6. The optical waveguide 5 includes a core part 51 that transmits light and a cladding part 52 that surrounds the core part 51. The cladding part 52 is provided around the core part 51 and sandwiches the core part 51 in any direction perpendicular to an extension direction of the core part 51, that is, a light propagation direction in the core part 51 (+X or −X direction, hereinafter collectively referred to as the "X direction"). The cladding part 52 surrounds the core part 51 in a plane perpendicular to the X direction.

Conductor circuits such as conductor patterns of the conductor layer 31 are formed in the electrical wiring part 200 directly below the optical wiring part 300. In addition to the conductor circuits, a metal layer with no electrical connection may be formed. Or, although not illustrated, conductor circuits and metal layers may be formed in a mixed manner. Although not illustrated, it is also possible that conductor circuits and metal layers are not formed in the electrical wiring part 200 directly below the optical wiring part 300.

The optical waveguide 5, that is, the core part 51 and the cladding part 52, are each formed using a material having an appropriate refractive index. The core part 51 and the cladding part 52 can be formed of, for example, an organic material (organic substance), an inorganic material (inorganic substance), or a hybrid material, such as an inorganic polymer, containing an organic component and an inorganic component. Examples of inorganic materials include quartz glass, silicon, and the like, and examples of organic materials include acrylic resins such as polymethylmethacrylate (PMMA), polyimide resins, polyamide resins, polyether resins, epoxy resins, and the like. An optical waveguide 5 formed of an organic material tends to be lightweight and highly flexible.

The core part 51 and cladding part 52 may be formed of materials different from each other or may be formed of materials of the same type. However, for the core part 51, a material having a higher refractive index than that used for the cladding part 52 is used so that total reflection of light at an interface between the core part 51 and the cladding part 52 is possible. It is also possible that, after the core part 51 and the cladding part 52 are formed using materials having the same refractive index, the refractive indices of the core part 51 and the cladding part 52 are made different from each other by appropriate processing.

The optical waveguide 5 is formed, for example, using a photolithography method (in which a material for the core part is patterned by exposure and development), a Mosquito method (in which a needle is caused to scan in the cladding part 52 while a material for forming the core part is ejected), an imprint method, or the like. However, the method of forming the optical waveguide 5 is not limited to these methods.

The optical waveguide 5 may be formed on the support plate 6. For example, the optical waveguide 5 and the support plate 6 may be joined by curing a material of the cladding part 52 in a semi-cured state on the support plate 6. Further, the optical waveguide 5 may be formed separately from the support plate 6 and fixed to the support plate 6 using, for example, any adhesive (not illustrated). The support plate 6 can also be fixed to the surface of the insulating layer 21, for example using any adhesive (not illustrated). However, the method for fixing the optical waveguide 5 and the support plate 6, and the method for fixing the support plate 6 and the insulating layer 21 are not particularly limited. The optical waveguide 5 can be fixed to the support plate 6 by any means. The support plate 6, that is, the optical wiring part 300, can also be fixed to the surface of the insulating layer 21 by any means.

In the example of FIGS. 1-3, the core part 51 has a first end part (5*a*) overlapping the component mounting region (A1) in a plan view, and a second end part (5*b*), which is an end part on the opposite side with respect to the first end part (5*a*). The core part 51 extends from the component mounting region (A1) toward an outer edge of the electrical wiring part 200. The core part 51 is exposed from the cladding part 52 at the first end part (5*a*). That is, at the first end part (5*a*), not only end surfaces of the core part 51 but also an upper surface (a surface on the opposite side with respect to the support plate 6) of the core part 51 is exposed from the cladding part 52. As illustrated in a circle (B) in FIG. 2 and in FIG. 3, at the first end part (5*a*), the core part 51 is positioned to face the light receiving or light emitting part (E1*b*) of the component (E1) when the wiring substrate 100 is used. Specifically, as illustrated in FIG. 3, the core part 51 is positioned such that an upper surface (5*a*1) of the core part 51 and the light receiving or light emitting surface (E1*c*) of the component (E1) face each other and are optically coupled. On the other hand, an end surface on the second end part (5*b*) side of the core part 51 is positioned to face and be optically coupled with an optical fiber (F) connected to the optical waveguide 5 when the wiring substrate 100 is used.

With the optical waveguide 5 positioned in this way, light propagated through the optical fiber (F) enters the optical waveguide 5 from the second end part (5*b*) of the core part 51, propagates through the core part 51, and enters the component (E1) via the light receiving or emitting part (E1*b*) from the first end part (5*a*) of the core part 51. That is, the component (E1) is optically coupled with the light transmitted through the optical waveguide 5. The light entered the component (E1) is converted into an electrical signal in the component (E1), and the electrical signal is output from the electrodes (E1*a*). The output electrical signal is input to the component (E2) via the conductor layer 11 and is processed. On the other hand, an electrical signal output from the component (E2) toward the component (E1) is input to the component (E1) via the electrodes (E1*a*) and is converted into light. The light exits from the light receiving or light emitting part (E1*b*) and enters the optical waveguide 5 from the first end part (5*a*). The incident light propagates in the core part 51 and exits from the second end part (5*b*) to the optical fiber (F).

In the present embodiment, the optical wiring part 300 includes the support plate 6, and the optical waveguide 5 is supported by the support plate 6. Therefore, the first and second end parts (5*a*, 5*b*) of the core part 51 of the optical waveguide 5 can be easily positioned at positions where they can be optically coupled with the light receiving or emitting part (E1*b*) of the component (E1) or the optical fiber (F) with sufficient efficiency. That is, as described above, the optical waveguide 5 that can be formed of any material such as various resins may have high flexibility. Therefore, it may be difficult to position and fix the optical waveguide 5 alone at an appropriate position on the electrical wiring part 200. Therefore, it may be possible that sufficient coupling efficiency is not obtained in the optical coupling between the optical waveguide 5 and the component (E1) and/or between the optical waveguide 5 and the optical fiber (F).

In contrast, in the present embodiment, the optical wiring part 300 includes the support plate 6 supporting the optical waveguide 5. Therefore, the optical waveguide 5 (specifically, the first and second end parts (5*a*, 5*b*) of the core part 51) can be easily positioned at an appropriate position. Therefore, it is thought that the optical waveguide 5 is optically coupled with the component (E1) and the optical fiber (F) with sufficient efficiency. Preferably, the support plate 6 has a higher rigidity than the optical waveguide 5. It is thought that the optical waveguide 5 can be more easily positioned at an appropriate position.

In the present embodiment, further, the support plate 6 provided in the optical wiring part 300 has a lower thermal expansion coefficient than the optical waveguide 5. Since the optical waveguide 5 can have a thermal expansion coefficient according to its constituent material, the core part 51 can be displaced with respect to the positions of the optical fiber (F) and/or the component (E1), according to a change in ambient temperature. Therefore, even when the optical waveguide 5 is appropriately positioned during the manufacturing of the wiring substrate 100, the efficiency of the optical coupling of the optical waveguide 5 with the optical fiber (F) and/or the component (E1) during use of the wiring substrate may be lower than during manufacturing.

In contrast, in the present embodiment, the support plate 6 that is provided in the optical wiring part 300 and supports the optical waveguide 5 has a lower thermal expansion coefficient than the optical waveguide 5. Therefore, the displacement of the core part 51 of the optical waveguide 5 due to a change in ambient temperature is suppressed. Therefore, it is thought that the decrease in the efficiency of the optical coupling of the optical waveguide 5 with the optical fiber (F) and/or the component (E1) in an environment where the temperature changes is suppressed. When the core part 51 and the cladding part 52 have different thermal expansion coefficients, the thermal expansion coefficient of the support plate 6 is lower than an average value of the thermal expansion coefficients of the core part 51 and the cladding part 52. Preferably, the thermal expansion coefficient of the support plate 6 is lower than the lower of the thermal expansion coefficients of the core part 51 and the cladding part 52.

In this way, the support plate 6 can be formed of any material so as to have a lower thermal expansion coefficient than the optical waveguide 5 and preferably have a higher rigidity than the optical waveguide 5. For example, the support plate 6 can have a higher bending rigidity than the optical waveguide 5. Examples of materials for the support plate 6 include: glasses such as soda-lime glass, borosilicate glass, and quartz glass; various metals such as tungsten, titanium, and molybdenum; various ceramics such as alumina, silicon nitride, and silicon oxide; and the like. The various metals forming the support plate 6 may be in a form of a metal plate or a metal foil.

The thermal expansion coefficient of the optical waveguide 5 is, for example, 10 ppm/° C.-100 ppm/° C. In contrast, the thermal expansion coefficient of the support plate 6 is 3 ppm/° C.-10 ppm/° C. The bending rigidity of the support plate 6 is, for example, 1.1 or more times the bending rigidity of the optical waveguide 5, and 2 or less times the bending rigidity of the electrical wiring part 200. It is thought that the optical waveguide 5 can be held so that it can be easily handled and that the optical wiring part 300 can follow the warping of the electrical wiring part 200 to some extent. The support plate 6 can have a thickness of, for example, about 30 μm or more and 1000 μm or less.

As illustrated in FIGS. 1 and 2, in the wiring substrate 100, the second end part (5*b*) of the core part 51 of the optical waveguide 5 and a portion of the cladding part 52 surrounding the second end part (5*b*) of the core part 51 protrude to an outer side of the electrical wiring part 200. That is, an end part of the optical wiring part 300 on the second end part (5*b*) side of the core part 51 protrudes from an outer edge of the electrical wiring part 200 to an outer side thereof. In other words, the optical wiring part 300 is positioned such that one end thereof protrudes from the outer edge of the electrical wiring part 200. Therefore, a connector (C) that connects the optical waveguide 5 and the optical fiber (F) can be easily attached to the optical waveguide 5. That is, the optical waveguide 5 and the optical fiber (F) can be easily optically coupled.

Further, in the example of FIG. 1 and the like, since the optical waveguide 5 and the optical fiber (F) are not connected on the electrical wiring part 200, that is, on the insulating layer 21 and the like, it is thought that a relative positional relationship between the optical waveguide 5 and the optical fiber (F) is unlikely to be affected by thermal expansion or contraction of the electrical wiring part 200. For example, even when the electrical wiring part 200 is deformed due to a change in temperature, it is thought that a displacement caused by the deformation is unlikely to extend to a site where the optical waveguide 5 and the optical fiber (F) are positively coupled. Therefore, it is thought that a state of the optical coupling between the optical waveguide 5 and the optical fiber (F) is unlikely to be affected by a change in ambient temperature.

In particular, in the example of FIGS. 1 and 2, together with the second end part (5*b*) of the core part 51, a portion of the support plate 6, that is, the end part of the support plate 6 on the second end part (5*b*) side of the core part 51, also protrudes to an outer side of the electrical wiring part 200. Therefore, the portion of the optical waveguide 5 that protrudes from the electrical wiring part 200 is also supported by the support plate 6. Therefore, compared to a case where only the optical waveguide 5 protrudes from the outer edge of the electrical wiring part 200, it is thought that the optical coupling between the optical waveguide 5 and the optical fiber (F) using the connector (C) is facilitated.

A length (L) of the portion of the optical wiring part 300 that protrudes from the outer edge of the electrical wiring part 200, that is, a distance (L) between the outer edge of the electrical wiring part 200 and a front end of the portion of the optical wiring part 300 that protrudes from the electrical wiring part 200, is 5 mm or more and 30 mm or less. It is thought that the coupling between the optical waveguide 5 and the optical fiber (F) described above can be facilitated while suppressing an increase in an overall planar size of the wiring substrate 100.

In the optical wiring part 300 in the example of FIG. 1 and the like, as illustrated in FIGS. 1 and 2, the optical waveguide 5 and the support plate 6 have substantially the same shape and substantially the same size in a plan view. Therefore, the optical waveguide 5 can be supported up to edges thereof on the support plate 6. Therefore, it is thought that edges of the optical wiring part 300 can be prevented from bending or floating. Further, since the support plate 6 is not larger than the optical waveguide 5, it is thought that it is unlikely to occupy a region larger than necessary in the electrical wiring part 200 for the arrangement of the optical wiring part 300.

In the example of FIG. 1 and the like, as illustrated in FIG. 2, the optical waveguide 5 has eight core parts 51 that are formed in parallel. In this way, the optical waveguide 5 provided in the wiring substrate of the embodiment can have multiple core parts 51. Then, in the example of FIG. 2, an arrangement pitch (P1) of the first end parts (5*a*) of the multiple core parts 51 is smaller than an arrangement pitch (P2) of the second end parts (5*b*) of the multiple core parts 51. For example, it may be possible that multiple optical fibers (F) optically coupled with the core parts 51 at the second end parts (5*b*) cannot be formed at a pitch as small as an arrangement pitch of multiple light receiving or light emitting parts (E1*b*) provided in the component (E1). Therefore, as in the example in FIG. 2, it may be possible that the multiple optical fibers (F) are formed at a pitch larger than the arrangement pitch of the light receiving or light emitting parts (E1*b*). In the example of FIG. 2, the multiple core parts 51 are formed at a larger pitch at the second end parts (5*b*) than at the first end parts (5*a*). Therefore, it is thought that, at the first end parts (5*a*) and the second end parts (5*b*), the component (E1) or the optical fibers (F) can be appropriately optically coupled with the core parts 51 without the need for a separate pitch conversion means.

For example, the arrangement pitch (P1) of the core parts 51 at the first end parts (5*a*) is 125 μm or more and 250 μm or less. Further, the arrangement pitch (P2) of the core parts 51 at the second end parts (5*b*) is, for example, 30 μm or more and 100 μm or less. However, the arrangement pitch of the core part 51 at each end side is not limited to these numerical examples.

As illustrated in FIG. 3, an upper cladding part 52 of the optical waveguide 5 is not formed up to an outer edge of the optical wiring part 300 on the first end part (5*a*) side of the core part 51. As a result, the upper surface (5*a*1) of the first end part (5*a*) of the core part 51 is exposed. Part of light propagating in the core part 51 toward the first end part (5*a*) leaks out of the core part 51 from the upper surface (5*a*1) as evanescent light and enters the light receiving or light emitting part (E1*b*) of the component (E1). That is, when the wiring substrate 100 is used, the upper surface (5*a*1) of the core part 51 is adiabatically coupled with the light receiving or light emitting part (E1*b*) of the component (E1). Since the upper surface (5*a*1) faces the light receiving or light emitting surface (E1*c*) of the component (E1) without intervention of the cladding part 52, it is thought that highly efficient optical coupling is realized.

Figure 4:
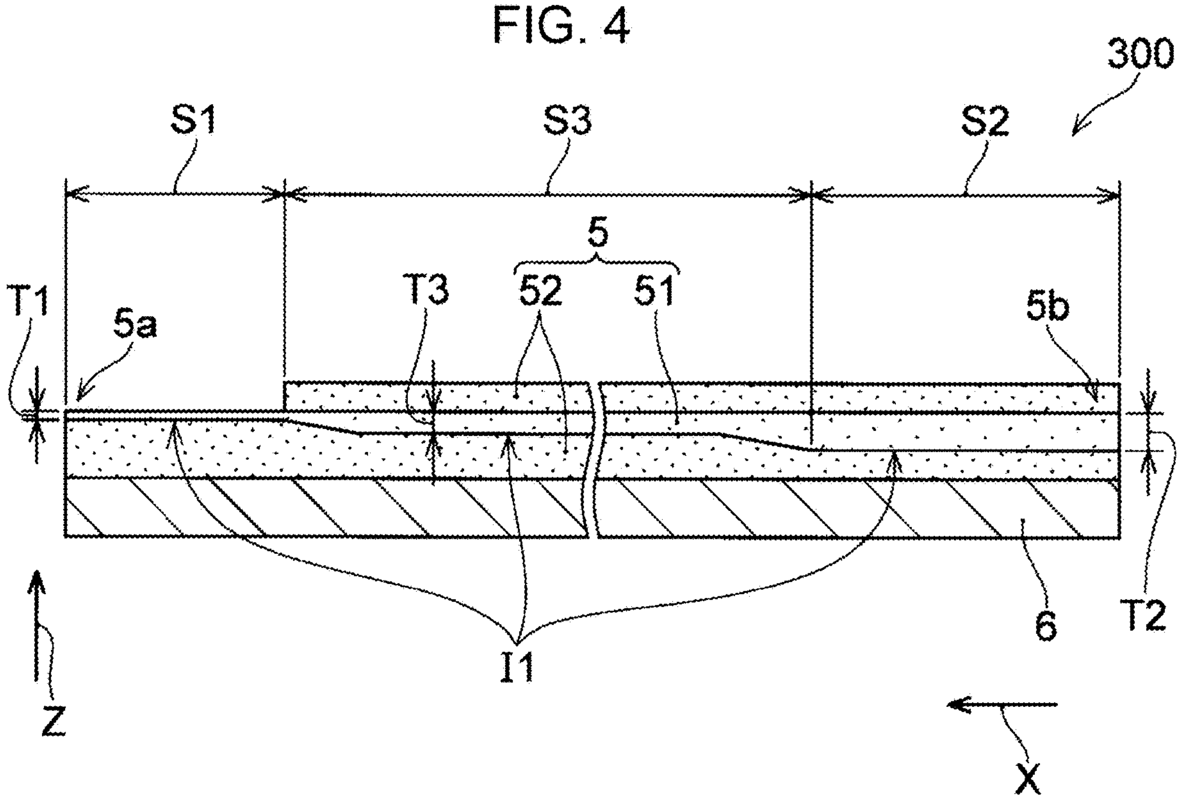
FIG. 4 is a cross-sectional view illustrating an optical wiring part of FIG. 1.

FIG. 4 illustrates an enlarged view of the optical wiring part 300 with a central portion in the X direction omitted. As illustrated in FIG. 4, in the present embodiment, the core part 51 in the optical wiring part 300 may have different thicknesses at the first end part (5*a*) and at the second end part (5*b*). In the example of FIG. 4, a thickness (T1) of the core part 51 at the first end part (5*a*) is smaller than a thickness (T2) of the core part 51 at the second end part (5*b*). A "thickness of the core part 51" is a distance in the Z direction between a point closest to the support plate 6 and a point farthest from the support plate 6 on an outer periphery of the core part 51 at a position between the first end part (5*a*) and the second end part (5*b*).

In the example of FIG. 4, a distance between the support plate 6 and an interface (I1) between a surface of the core part 51 on the support plate 6 side and the cladding part 52 varies between the first end part (5*a*) and the second end part (5*b*). Specifically, the distance between the interface (I1) and the support plate 6 is longer at the first end part (5*a*) than at the second end part (5*b*). A position of the interface (I1) in the Z direction is farther from the support plate 6 at the first end part (5*a*) than at the second end part (5*b*). On the other hand, a distance between the support plate 6 and a surface of the core part 51 on the opposite side with respect to the support plate 6 is substantially constant between the first end part (5*a*) and the second end part (5*b*). Therefore, the thickness of the core part 51 is smaller at the first end part (5*a*) than at the second end part (5*a*).

Further, in the example of FIG. 4, the thickness of the core part 51 decreases stepwise from the end surface on the second end part (5*b*) side to the end surface on the first end part (5*a*) side. That is, the core part 51 has a thickness (T1) in a section (S1) having a predetermined length from the end surface on the first end part (5*a*) side, a thickness (T2) in a section (S2) having a predetermined length from the end surface on the second end part (5*b*) side, and a thickness (T3) in a section (S3) between the section (S1) and the section (S2). The thickness (T3) is smaller than the thickness (T2) and larger than the thickness (T1). A region between the thickness (T3) and the thickness (T2) is a thickness varying region, and a region between the thickness (T3) and the thickness (T1) is a thickness varying region. Since the thickness of the core part 51 does not change significantly at one location, it is thought that light propagating in the core part 51 is likely to be totally reflected.

The optical fibers (F) (see FIG. 1) optically coupled to the second end parts (5*b*) can have a core diameter larger than a width of the multiple light receiving or light emitting parts (E1*b*) (length in the arrangement pitch direction of the multiple light receiving or light emitting parts (E1*b*)) of the component (E1) optically coupled to the first end parts (5*a*) (see FIG. 1). For example, the core diameter of the optical fibers (F) may be about 10 μmφ, and the width of the light receiving or light emitting parts (E1*b*) may be about 0.5 μm. On the other hand, in terms of the formation of the core part 51 of the optical waveguide 5, the core part 51 preferably has a thickness that is substantially the same as or smaller than a width thereof (a length in the arrangement pitch direction of the multiple core parts 51). When the core part 51 has the same thickness at both the first end part (5*a*) and the second end part (5*b*), there may be a discrepancy between the width and thickness of the core part 51 and the core diameter of the optical fiber (F) at the second end part (5*b*). Or, there may be a discrepancy between the width of the core part 51 and the width of the light receiving or emitting part (E1*b*) at the first end part (5*a*). In this case, for example, only a very small portion of the light emitted from the optical fiber (F) may be received by the optical waveguide 5. Similarly, only a very small portion of the light emitted from the optical waveguide 5 may be received by the light receiving or emitting part (E1*b*).

However, in the optical wiring part 300 in the example of FIG. 4, the thickness (T1) of the core part 51 at the first end part (5*a*) is smaller than the thickness (T2) of the core part 51 at the second end part (5*b*). Therefore, compared to the case where the thickness of the core part 51 is constant, light can be transmitted efficiently with less optical loss at each of the first and second end parts (5*a*, 5*b*). Since less light is lost without being received, it may be possible that a light intensity required for light generated by a light source (not illustrated) is reduced. Therefore, it may be possible that power consumption by the light source is reduced.

Further, the core part 51 of the optical waveguide 5 illustrated in FIG. 4 is integrally formed from the first end part (5*a*) to the second end part (5*b*). Therefore, compared to a case where the thickness of the core part is converted by combining multiple light transmission means having mutually different core thicknesses, it may be possible that the wiring substrate 100, with its formation being facilitated, can be manufactured at low cost. Preferably, the entire optical waveguide 5 is integrally formed from an end part including the first end part (5*a*) of the core part 51 to an end part including the second end part (5*b*) of the core part 51.

Figure 5A:
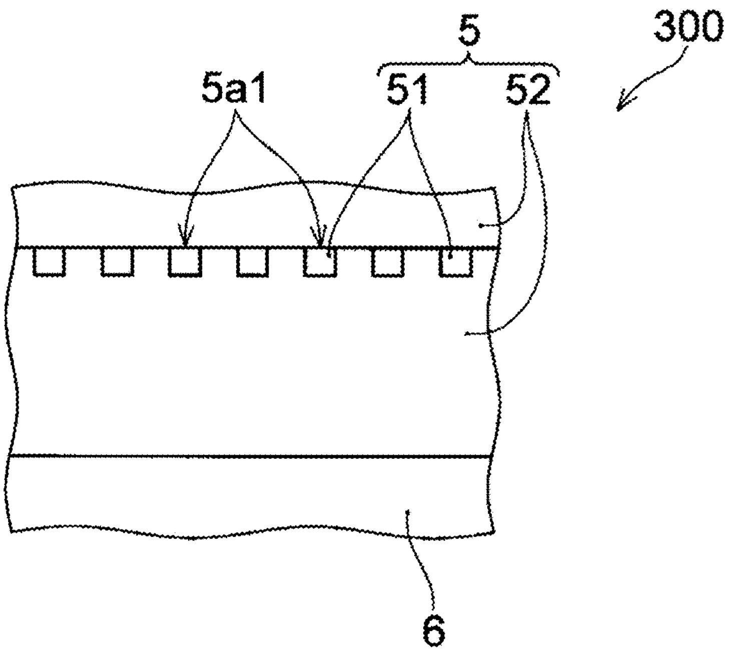
FIG. 5A is a side view partially illustrating an example of an end surface of the optical wiring part of FIG. 1.
Figure 5B:
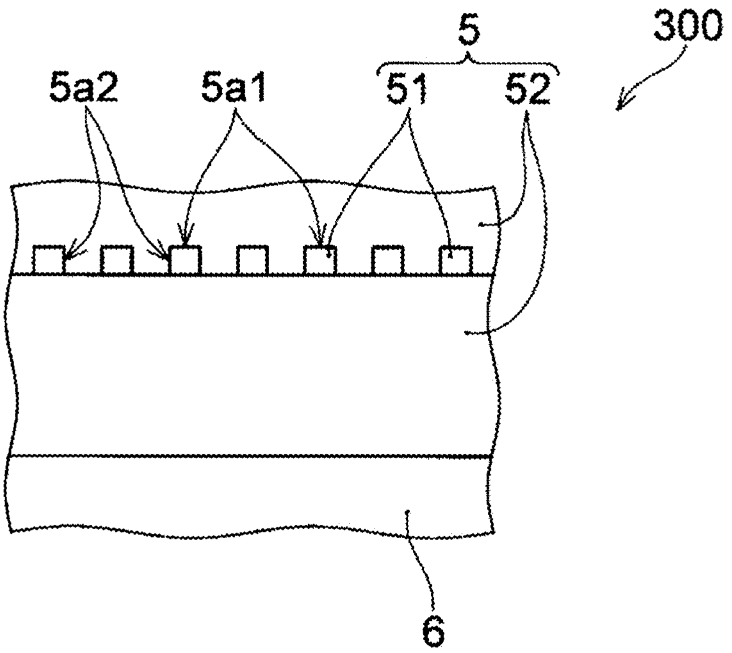
FIG. 5B is a side view partially illustrating another example of the end surface of the optical wiring part of FIG. 1.

FIGS. 5A and 5B partially illustrate examples of an end surface of the optical wiring part 300 on the first end part (5*a*) (see FIG. 4) side of the core part 51. In the example of FIG. 5A, only the upper surface (5*a*1) of the core part 51 is exposed without being covered by the cladding part 52. On the other hand, in the example of FIG. 5B, in addition to the upper surface (5*a*1), side surfaces (5*a*2) of the core part 51 are also exposed without being covered by the cladding part 52. In this way, it is possible that, in a portion of the core part 51 optically coupled with the component (E1) (see FIG. 1), only an opposing surface (the upper surface (5*a*1)) facing the component (E1) is exposed, or, together with the opposing surface facing the component (E1), surfaces (the side surfaces (5*a*2)) adjacent to the opposing surface are also exposed.

Figure 6:
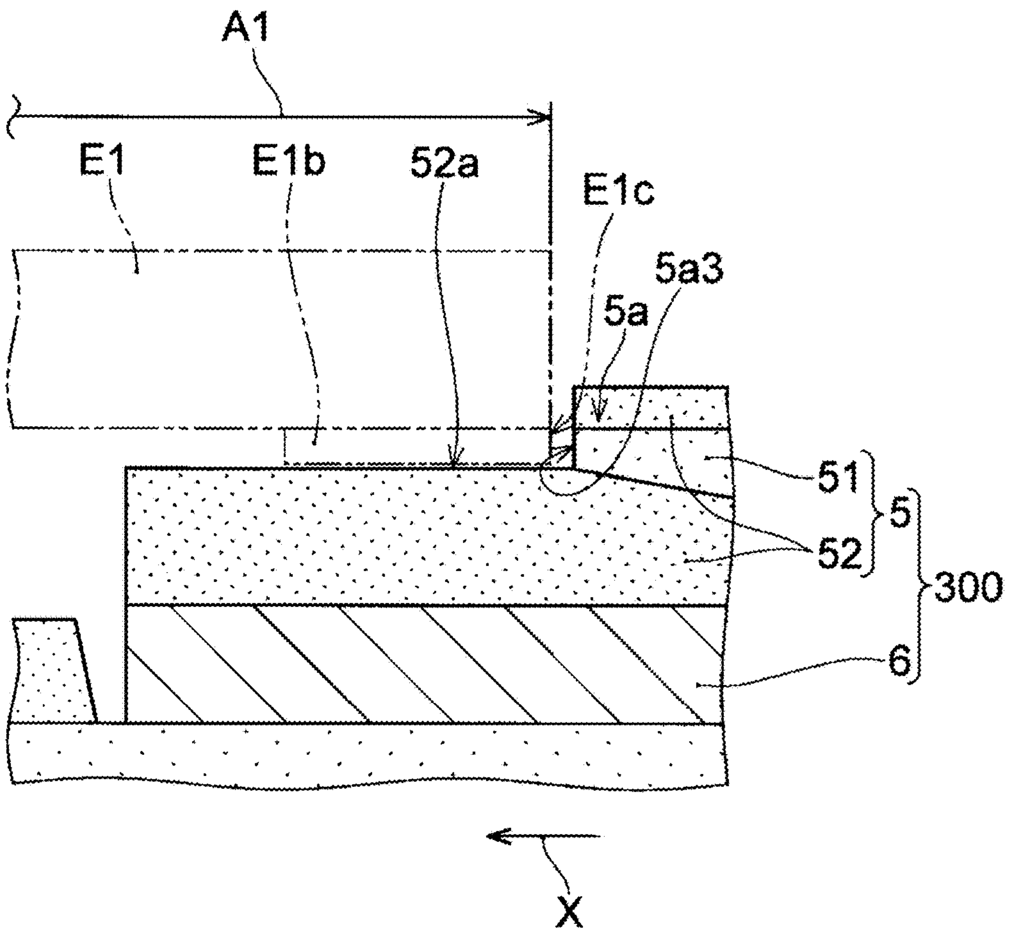
FIG. 6 is an enlarged view illustrating a modified example of the portion (III) of FIG. 1.

FIG. 6 is an enlarged view illustrating a modified example of the portion (III) of FIG. 1. In the example of FIG. 6, the core part 51 of the optical waveguide 5 is not formed up to the outer edge of the optical wiring part 300 on the first end part (5*a*) side. An end surface (5*a*3) of the core part 51 is exposed on an upper surface (52*a*) of the cladding part 52 on the support plate 6 side of the core part 51. Then, the component (E1) is mounted on an exposed portion of the upper surface (52*a*) of the cladding part 52 so as to partially overlap with the upper surface (52*a*). Therefore, although a part of the optical wiring part 300 overlaps with the component mounting region (A1) in a plan view, the first end part (5*a*) of the core part 51 is adjacent to, without overlapping with, the component mounting region (A1) in a plan view.

The end surface (5*a*3) of the core part 51 faces the component mounting region (A1) in a direction (the X direction) along the light propagation direction in the core part 51. Then, as illustrated in FIG. 6, when the component (E1) is mounted, the end surface (5*a*3) can face the light receiving or emitting surface (E1*c*) facing sideways in the light receiving or emitting part (E1*b*). In this way, the core part 51 may be formed to face the light receiving or emitting part (E1*b*) of the component (E1) in the X direction on a lateral side of the component (E1).

Figure 7:
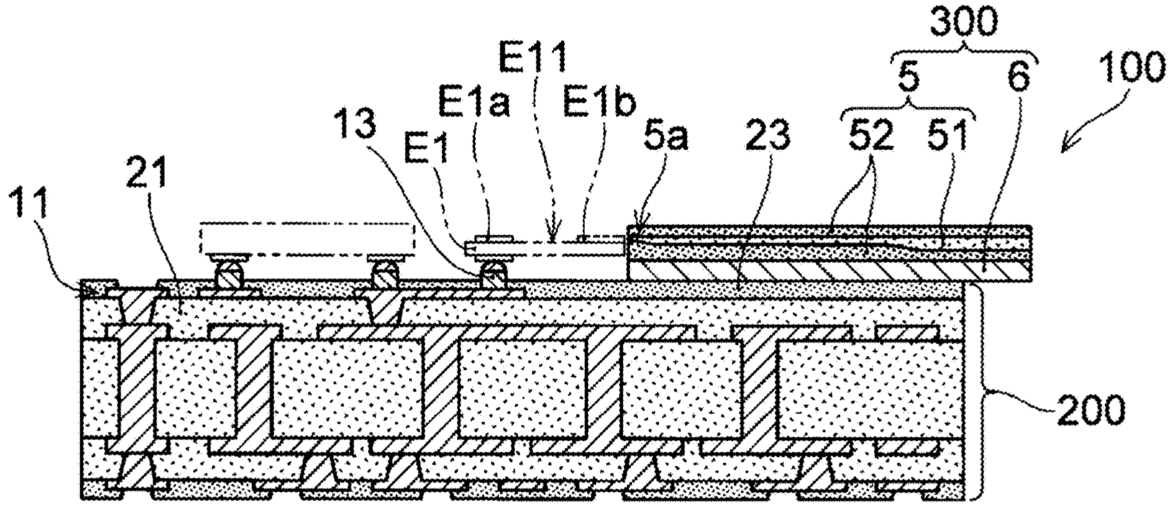
FIG. 7 is a cross-sectional view illustrating another example of a mounting form of an optical wiring part in a wiring substrate according to an embodiment of the present invention.

FIG. 7 illustrates another example of a mounting form of the optical wiring part 300 in the wiring substrate 100 of the embodiment. In the example of FIG. 7, the optical wiring part 300 is formed on the solder resist 23 covering the insulating layer 21 and the conductor layer 11. In the wiring substrate of the embodiment, as illustrated in FIG. 7, it is also possible that the optical wiring part 300 is formed on the solder resist 23 instead of on an interlayer insulating layer such as the insulating layer 21. For example, the optical wiring part 300 may be formed on the conductor layer 11 via the solder resist 23.

Further, in the example of FIG. 7, the light receiving or emitting part (E1*b*) of the component (E1) is provided together with the electrodes (E1*a*) on a surface (E11) of the component (E1) facing away from the electrical wiring part 200. The electrodes (E1*a*) are electrically connected to the conductor posts 13 via electrodes (not illustrated) penetrating the component (E1). The core part 51 of the optical waveguide 5 is provided such that the end surface thereof on the first end part (5*a*) side faces the light receiving or emitting part (E1*b*) provided on the surface (E11) of the component (E1). For example, the height of the core part 51 from the surface of the electrical wiring part 200 can be adjusted by appropriately selecting the thickness of the support plate 6 or the thickness of the cladding part 52 on the support plate 6 side of the core part 51. Therefore, the core part 51 can be provided to face and optically couple with the light receiving or emitting part (E1*b*), regardless of whether the light receiving or emitting part (E1*b*) is provided on the surface of the component (E1) facing the electrical wiring part 200 side or on the opposite surface (the surface (E11)) of the component (E1).

Except for the point that the optical wiring part 300 is formed on the solder resist 23 and the point that the core part 51 faces the light receiving or emitting part (E1*b*) on the surface (E11) of the component (E1), the wiring substrate 100 of FIG. 7 has the same structural elements and structure as the wiring substrate 100 of FIG. 1. A structural element that is the same as a structural element included in the wiring substrate 100 illustrated in FIG. 1 is indicated in FIG. 7 using the same reference numeral symbol as the one used in FIG. 1 or is omitted as appropriate, and a repetitive description thereof is omitted.

Figure 8A:
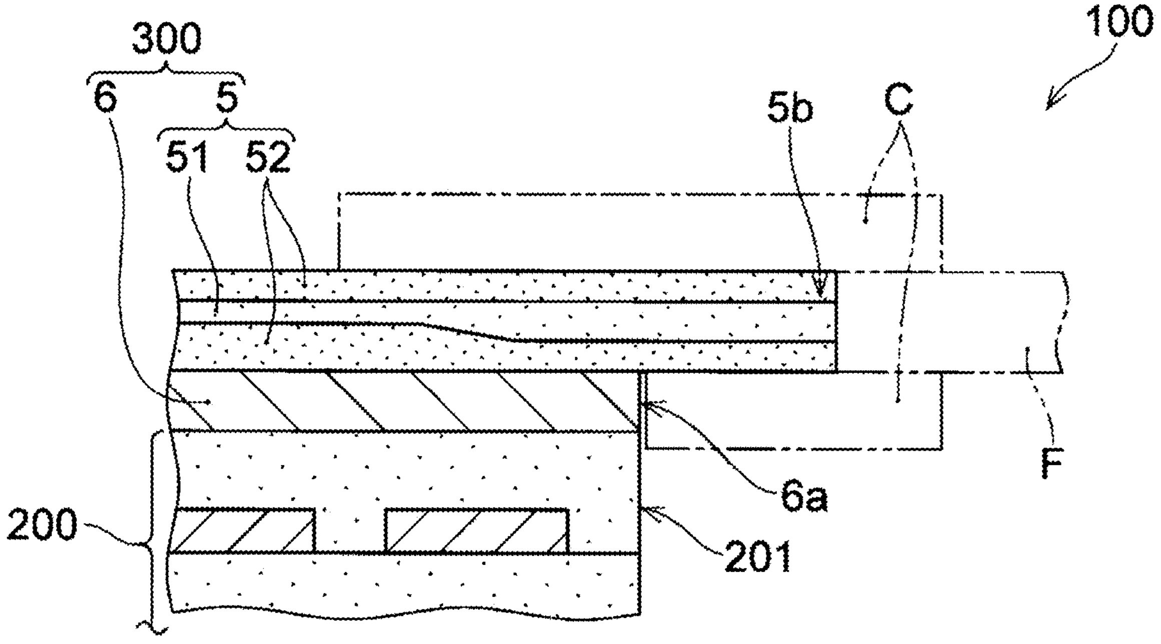
FIG. 8A is an enlarged view illustrating another example of an edge part of a wiring substrate according to an embodiment of the present invention.
Figure 8B:
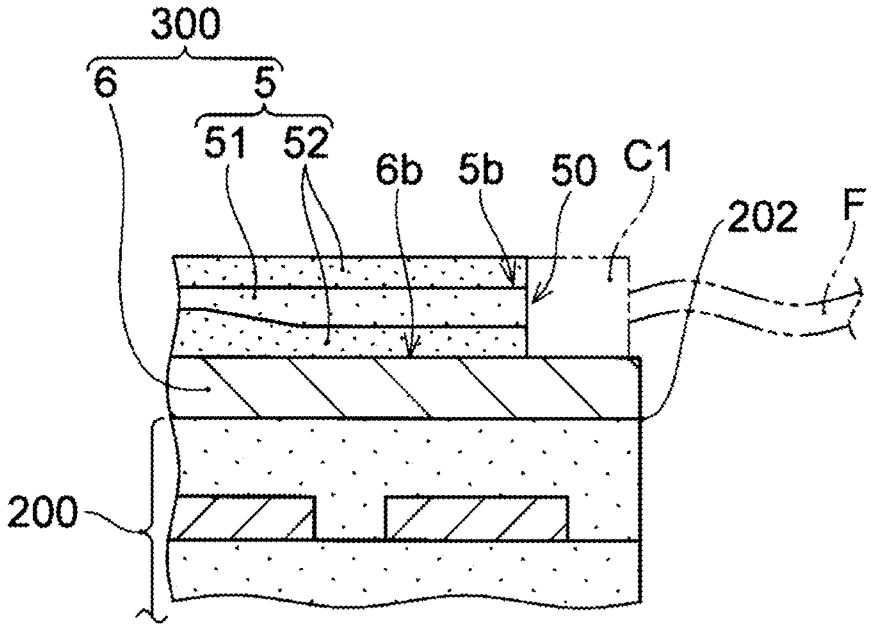
FIG. 8B is an enlarged view illustrating still another example of the edge part of a wiring substrate according to an embodiment of the present invention.

FIGS. 8A and 8B are respectively enlarged views illustrating other examples of an edge part of the wiring substrate 100 of the embodiment including the second end part (5*b*) of the core part 51 of the optical waveguide 5. In the example of FIG. 8A, similar to the example of FIG. 1, the second end part (5*b*) of the core part 51 of the optical waveguide 5 and the portion of the cladding part 52 surrounding the second end part (5*b*) of the core part 51 protrude to an outer side of the electrical wiring part 200. However, in the example of FIG. 8A, the support plate 6 does not protrude to an outer side of the electrical wiring part 200. In a plan view, an outer edge of the support plate 6 substantially coincides with the outer edge of the electrical wiring part 200. An end surface (6*a*) of the support plate 6 is substantially flush with a side surface 201 of the electrical wiring part 200. As in the example of FIG. 8A, in the optical wiring part 300, it is also possible that only the optical waveguide 5 protrudes to an outer side of the electrical wiring part 200 without the support plate 6 protruding to an outer side of the electrical wiring part 200. Even in this case, the connector (C) can be easily attached to the optical waveguide 5, and the optical waveguide 5 and the optical fiber (F) can be easily optically coupled.

In the example of FIG. 8B, the optical waveguide 5 is not formed up to an outer edge 202 of the electrical wiring part 200. An end surface 50 of the core part 51 of the optical waveguide 5 on the second end part (5*b*) side is positioned in the electrical wiring part 200 on an inner side of the outer edge 202 of the electrical wiring part 200. Therefore, a portion of a surface (6*b*) of the support plate 6 on the optical waveguide 5 side is exposed without being covered by the optical waveguide 5. In the example of FIG. 8B, a connector (C1) that optically couples the optical fiber (F) and the optical waveguide 5 is formed on the exposed portion of the surface (6*b*). Since both the optical waveguide 5 and the connector (C1) are formed on the support plate 6 having a relatively low thermal expansion coefficient, it is thought that, even when the ambient temperature changes, a positional displacement between the optical fiber (F) and the core part 51 is unlikely to occur, and the optical coupling efficiency is unlikely to decrease. Even when the optical waveguide 5 is provided as in the example of FIG. 8B, the connector (C1) does not necessarily have to be formed on the support plate 6. In the wiring substrate of the present embodiment, as in the example of FIG. 8B, the optical waveguide 5 and the support plate 6 do not necessarily have to protrude to an outer side of the electrical wiring part 200.

Figure 9A:
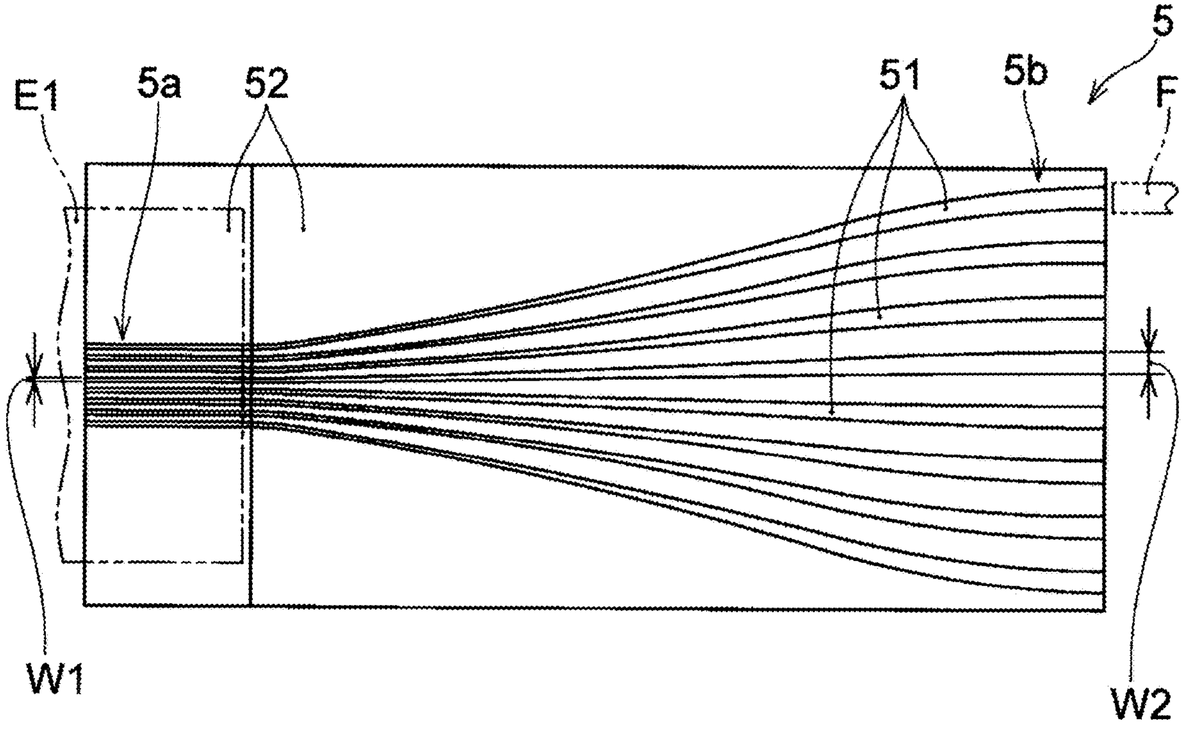
FIG. 9A is a plan view illustrating another example of an optical waveguide according to an embodiment of the present invention.

FIG. 9A illustrates a plan view of another example of the optical waveguide 5 according to the present embodiment. In FIG. 9A, for easy understanding, the core part 51 including a portion covered by the cladding part 52 is indicated with a solid line. Also in the example of FIG. 9A, the arrangement pitch of the multiple core parts 51 at the first end parts (5*a*) is smaller than the arrangement pitch of the multiple core parts 51 at the second end parts (5*b*). Further, in the example of FIG. 9A, a width (W1) of each core part 51 (a length of each core part 51 in a direction perpendicular to the light propagation direction) at the first end part (5*a*) is smaller than a width (W2) of each core part 51 at the second end part (5*b*).

As described above, the optical fibers (F) coupled to the second end parts (5*b*) can have a larger core diameter than the width of the multiple light receiving or emitting parts (E1*b*) (see FIG. 1) of the component (E1) coupled to the first end parts (5*a*). When the core part 51 has the same width at both the first end part (5*a*) and the second end part (5*b*), there may be a discrepancy between the width of the core part 51 and the core diameter of the optical fiber (F) at the second end part (5*b*). Or, there may be a discrepancy between the width of the core part 51 and the width of the light receiving or emitting part (E1*b*) at the first end part (5*a*). In this case, as described above, it is thought that most of emitted light cannot reach a light receiving side and is lost between the optical fiber (F) and the optical waveguide 5 and/or between the optical waveguide 5 and the component (E1). That is, the optical coupling efficiency is low, and therefore, the light source (not illustrated) may consume more power than originally required.

In contrast, in the example of FIG. 9A, since the width of each core part 51 is smaller at the first end part (5*a*) than at the second end part (5*b*), it is thought that less light is lost without entering a light receiving side between the optical fiber (F) and the optical waveguide 5 and/or between the optical waveguide 5 and the component (E1). That is, it is thought that the optical waveguide 5 optically couples with the optical fiber (F) and/or the component (E1) with high efficiency, and therefore the power consumption at the light source is also suppressed.

In the example of FIG. 9A, the width of each core part 51 continuously decreases from the second end part (5*b*) toward the first end part (5*a*). It is thought that light propagating through each core part 51 is likely to be totally reflected within the core part. However, as in the example of FIG. 9A, the width of the core part 51 that varies between the two end parts may vary stepwise between the two end parts.

Figure 9B:
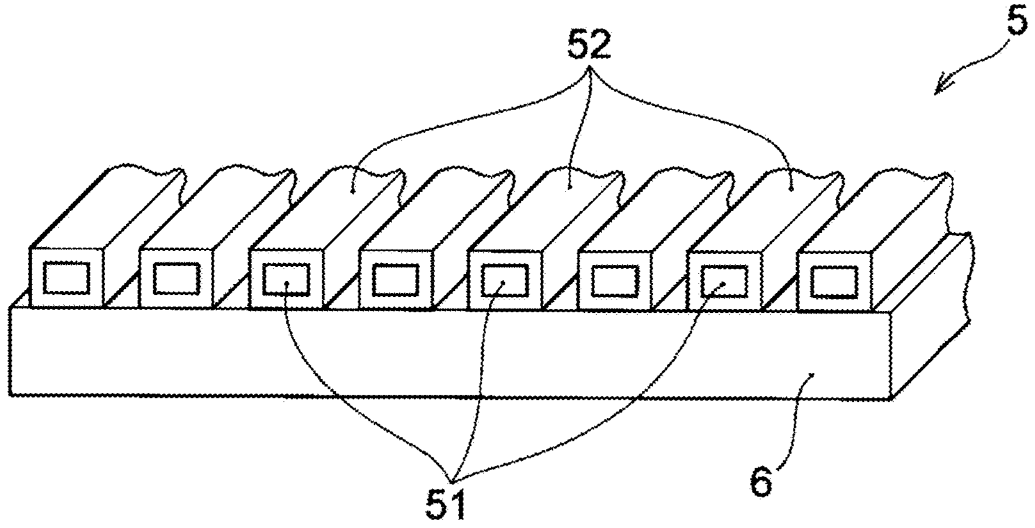
FIG. 9B is a perspective view illustrating still another example of an optical waveguide according to an embodiment of the present invention.

FIG. 9B illustrates a perspective view of yet another example of the optical waveguide 5 according to the present embodiment. Also in the example of FIG. 9B, the optical waveguide 5 has multiple parallel core parts 51. On the other hand, the cladding part 52 is divided into multiple cladding parts 52 respectively for the multiple core parts 51. That is, the multiple core parts 51 are respectively surrounded independently of each other by the multiple cladding parts. In the present embodiment, as in the example of FIG. 9B, the optical waveguide 5 may include the multiple cladding parts 52 that are respectively provided for the multiple core parts 51.

Figure 10A:
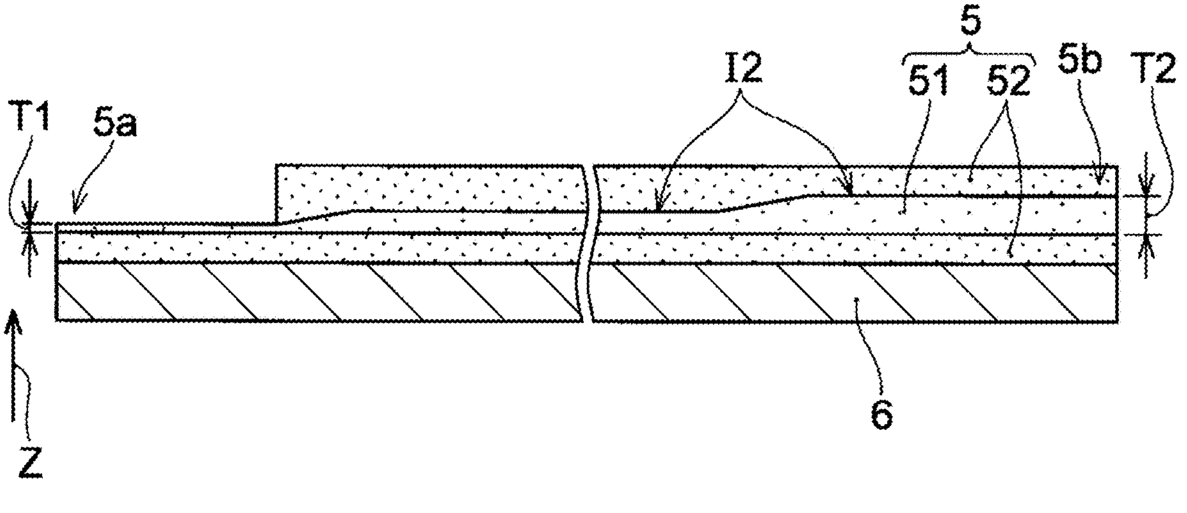
FIG. 10A is a cross-sectional view illustrating still another example of an optical waveguide according to an embodiment of the present invention.
Figure 10B:
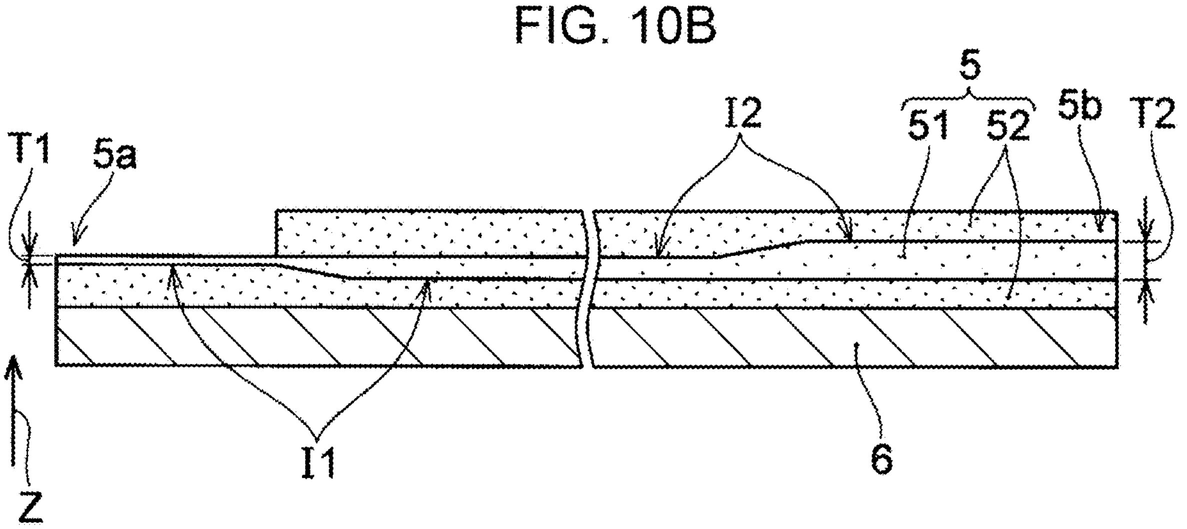
FIG. 10B is a cross-sectional view illustrating still another example of an optical waveguide according to an embodiment of the present invention.
Figure 10C:
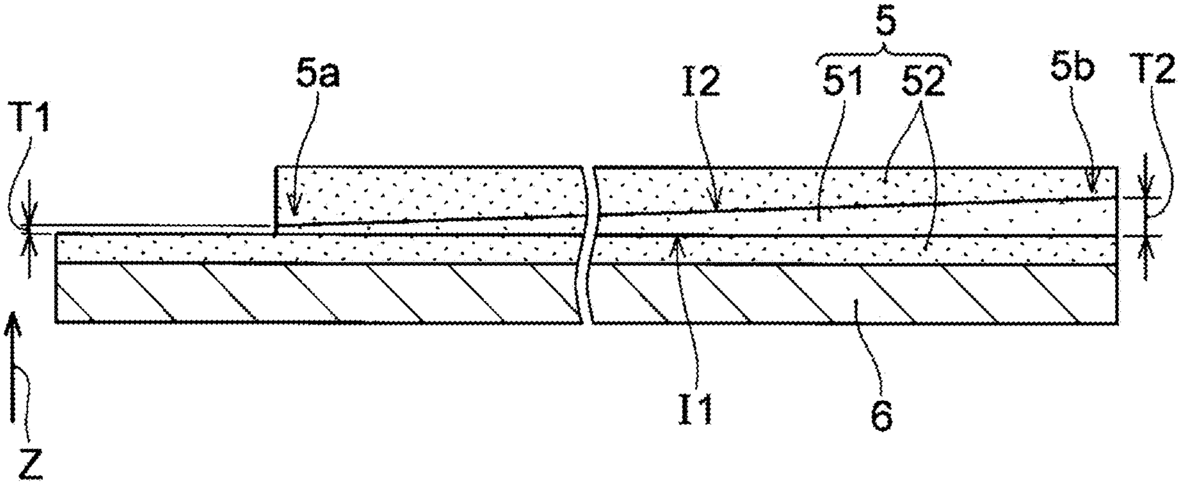
FIG. 10C is a cross-sectional view illustrating still another example of an optical waveguide according to an embodiment of the present invention.

FIGS. 10A-10C are respectively cross-sectional views illustrating still other examples of the optical waveguide according to the present embodiment. Also in the examples of FIGS. 10A-10C, the thickness (T1) of the core part 51 at the first end part (5*a*) is smaller than the thickness (T2) of the core part 51 at the second end part (5*b*).

In the example of FIG. 10A, a distance between the support plate 6 and an interface (I2) between the surface of the core part 51 on the opposite side with respect to the support plate 6 side and the cladding part 52 varies between the first end part (5*a*) and the second end part (5*b*). Specifically, the distance between the interface (I2) and the support plate 6 is shorter on the first end part (5*a*) side than on the second end part (5*b*) side. A position of the interface (I2) in the Z direction is closer to the support plate 6 at the first end part (5*a*) than at the second end part (5*b*). On the other hand, a distance between the support plate 6 and the surface of the core part 51 on the support plate 6 side is substantially constant between the first end part (5*a*) and the second end part (5*b*). Therefore, the thickness of the core part 51 is smaller at the first end part (5*a*) than at the second end part (5*a*).

In the example of FIG. 10B, both the distance between the interface (I2) and the support plate 6 and the distance between the support plate 6 and the interface (I1) between the surface of the core part 51 on the support plate 6 side and the cladding part 52 vary between the first end part (5*a*) and the second end part (5*b*). The position of the interface (I2) in the Z direction is closer to the support plate 6 at the first end part (5*a*) than at the second end part (5*b*). On the other hand, the position of the interface (I1) in the Z direction is farther from the support plate 6 at the first end part (5*a*) than at the second end part (5*b*). In the example of FIG. 10B, the positions of the interface (I1) and the interface (I2) in the Z-direction vary alternately, each varying stepwise.

On the other hand, in the example of FIG. 10C, the thickness of the core part 51 continuously decreases from the end surface on the second end part (5*b*) side to the end surface on the first end part (5*a*) side. Specifically, the interface (I2) between the surface of the core part 51 on the opposite side with respect to the support plate 6 side and the cladding part 52 is inclined at a predetermined angle from the end surface on the second end part (5*b*) side toward the end surface on the first end part (5*a*) side, becoming closer to the support plate 6 on the first end part (5*a*) side. That is, the interface (I2) is tapered. Since there is no abrupt change in the thickness of the core part 51 from the first end part (5*a*) to the second end part (5*b*), it is thought that light propagating through the core part 51 is likely to be totally reflected. Unlike the example of FIG. 10C, it is also possible that the angle of the inclination of the interface (I2) varies from the second end part (5*b*) side to the first end part (5*a*) side. Further, the interface (I1) between the surface of the core part 51 on the support plate 6 side and the cladding part 52 may be inclined from the second end part (5*b*) side to the first end part (5*a*) side, becoming farther from the support plate 6 on the first end part (5*a*) side. As illustrated in FIGS. 10A-10C, the thickness of the core part 51 can vary in any manner.

Next, an example of a method for manufacturing the wiring substrate of the embodiment is described with reference to FIGS. 11A-11E, using the wiring substrate 100 of FIG. 1 as an example.

Figure 11A:
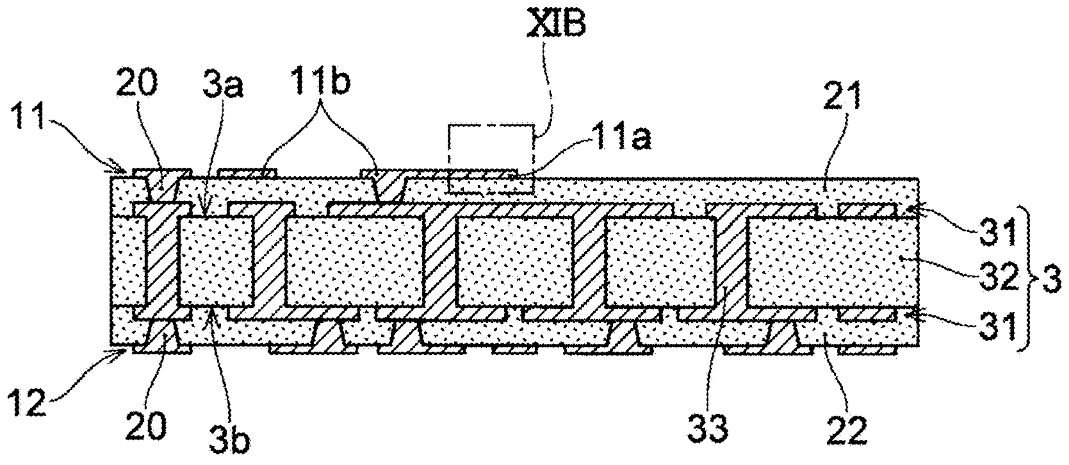
FIG. 11A is a cross-sectional view illustrating an example of a manufacturing process of a wiring substrate according to embodiment of the present invention.

As illustrated in FIG. 11A, the insulating layers (21, 22) and the conductor layers (11, 12) are formed on both sides of the core substrate 3. For example, the conductor layers 31, which have desired conductor patterns, and the through-hole conductors 33 are formed using a subtractive method on or in a double-sided copper-clad laminated substrate including an insulating layer that is to become the insulating layer 32 of the core substrate 3. Then, the insulating layer 21 is formed on the first surface (3*a*) of the core substrate 3, and the insulating layer 22 is formed on the second surface (3*b*) of the core substrate 3. The insulating layer 21 and the insulating layer 22 are each formed, for example, by laminating and thermocompression bonding a film-like epoxy resin on the core substrate 3. Through holes for forming the via conductors 20 are formed in the insulating layers, for example, by irradiation with $CO_2$ laser or the like. Then, the conductor layer 11 is formed on the insulating layer 21, and the conductor layer 12 is formed on the insulating layer 22. The conductor layer 11 is formed to include predetermined conductor patterns such as the conductor pads (11*a*, 11*b*). The conductor layer 11 and the conductor layer 12 are each formed, for example, using a semi-additive method.

Figure 11B:
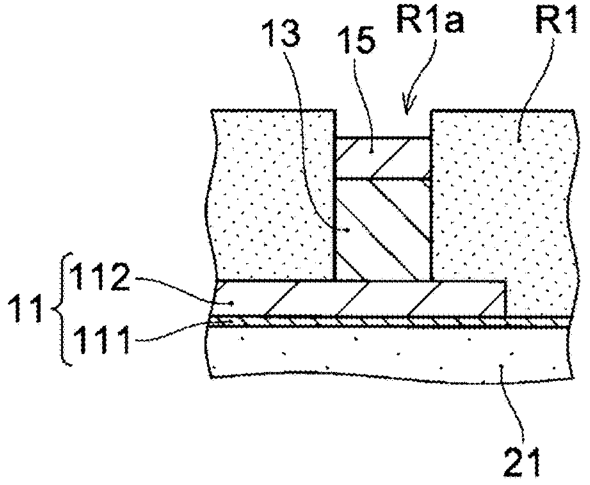
FIG. 11B is a cross-sectional view illustrating an example of a manufacturing process of a wiring substrate according to embodiment of the present invention.

As illustrated in FIG. 11B, the conductor posts 13 are formed. FIG. 11B illustrates an enlarged view of a portion (XIB) of FIG. 11A after the formation of the conductor posts 13. Although not illustrated in FIG. 11B, the conductor posts 14 (see FIG. 11C) are also formed together with the conductor posts 13. In the formation of the conductor layer 11 and the like using a semi-additive method, as illustrated in FIG. 11B, a metal film 111 is formed on the entire surface of the insulating layer 21, for example, by electroless plating. A plating film 112 is formed by pattern plating including electrolytic plating using the metal film 111 as a power feeding layer.

After a plating resist (not illustrated) used for the pattern plating is removed, with the metal film 111 remaining on the entire surface, a plating resist (R1) having openings (R1*a*) at formation sites of the conductor posts 13 is formed on the conductor layer 11 and insulating layer 21. For example, the plating resist (R1) is formed using a photolithography technology. Then, in the openings (R1*a*), for example, the conductor posts 13 are respectively formed by electrolytic plating using the metal film 111 as a power feeding layer.

Further, as illustrated in FIG. 11B, the connection layer 15 is formed on end surfaces of the conductor posts 13 by electrolytic plating using the metal film 111 as a power feeding layer. As the connection layer 15, for example, a metal film formed of tin, a tin alloy, a gold alloy, or the like is formed. After the formation of the connection layer 15, the plating resist (R1) is removed using a suitable peeling agent. Then, a portion of the metal film 111 that is not covered by the plating film 112 is removed, for example, by quick etching.

Figure 11C:
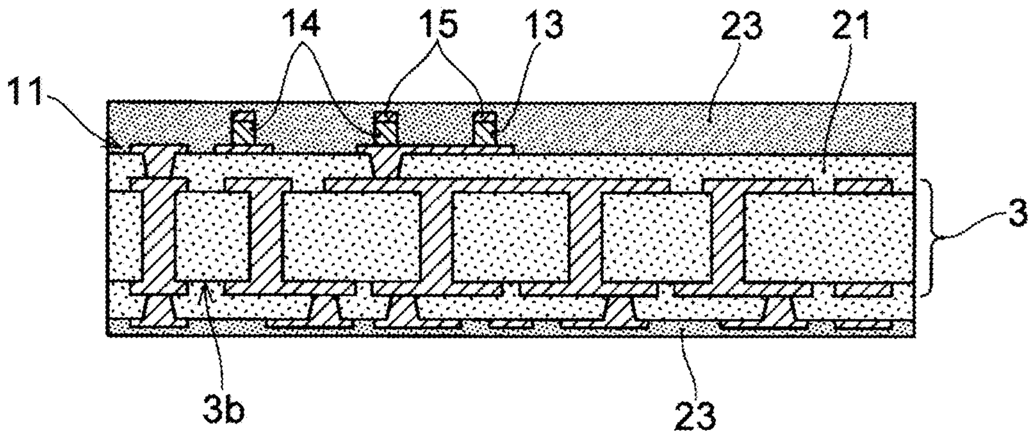
FIG. 11C is a cross-sectional view illustrating an example of a manufacturing process of a wiring substrate according to embodiment of the present invention.

As illustrated in FIG. 11C, the solder resist 23 covering the insulating layer 21, the conductor layer 11, the conductor posts (13, 14), and the connection layer 15 is formed. The solder resist 23 is formed, for example, by supplying a liquid or sheet-like epoxy resin or polyimide resin, or the like onto the insulating layer 21 and the structural elements on the surface of the insulating layer 21 using a method such as printing, coating, spraying, or laminating. The solder resist 23 is fully cured or temporarily cured by heating or UV irradiation or the like when necessary. Also on the second surface (3*b*) side of the core substrate 3, the solder resist 23 is formed by coating or laminating an epoxy resin or a polyimide resin.

Figure 11D:
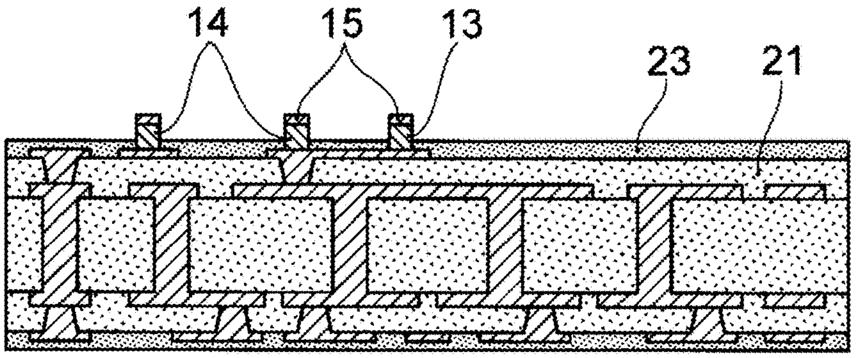
FIG. 11D is a cross-sectional view illustrating an example of a manufacturing process of a wiring substrate according to embodiment of the present invention.

As illustrated in FIG. 11D, a portion of the solder resist 23 in the thickness direction is removed such that end portions of the conductor posts (13, 14) on the opposite side with respect to the insulating layer 21 are exposed together with the connection layer 15 from the solder resist 23. Due to the reduction in the thickness of the solder resist 23, the end portions of the conductor posts (13, 14) on the opposite side with respect to the insulating layer 21 are exposed. The portion of the solder resist 23 can be removed, for example, by dry etching such as plasma etching using a carbon tetrafluoride ($CF_4$) gas, blasting, or the like.

Figure 11E:
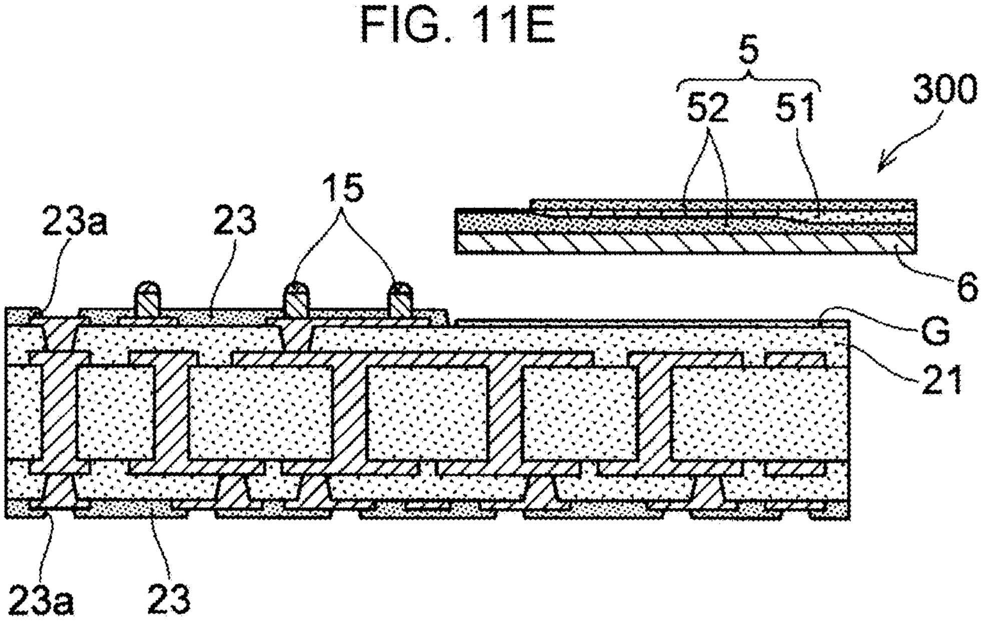
FIG. 11E is a cross-sectional view illustrating an example of a manufacturing process of a wiring substrate according to embodiment of the present invention.

As illustrated in FIG. 11E, a portion of the solder resist 23 corresponding to a region where the optical wiring part 300 is to be provided is removed, for example, by irradiation with $CO_2$ laser or the like. A region of the surface of the insulating layer 21 where the optical wiring part 300 is to be provided is exposed. By the laser processing, openings (23*a*) can be formed in the solder resist 23.

The optical wiring part 300 including the support plate 6 and the optical waveguide 5 formed on the support plate 6 is prepared. As described above, the optical waveguide 5 is formed, for example, using a photolithography method, a Mosquito method, or an imprint method, or the like. As described later, the optical waveguide 5 may be formed, for example, on a support plate 6 formed of glass, or may be bonded on a separately prepared support plate 6 using any adhesive (not illustrated) after forming the core part 51 and the cladding part 52.

For example, any adhesive (G), such as a thermosetting, room temperature curable, or photocurable adhesive, is supplied to a predetermined portion of the surface of the insulating layer 21 exposed from the solder resist 23, and the optical wiring part 300 having the optical waveguide 5 is mounted thereon. When necessary, a curing treatment of the adhesive (G) by heating or the like is performed, and the optical wiring part 300 is fixed. Further, the connection layer 15 is once melted by a reflow process or the like and is shaped into a hemispherical shape. Through the above processes, the wiring substrate 100 in the example of FIG. 1 is completed.

Figure 12A:
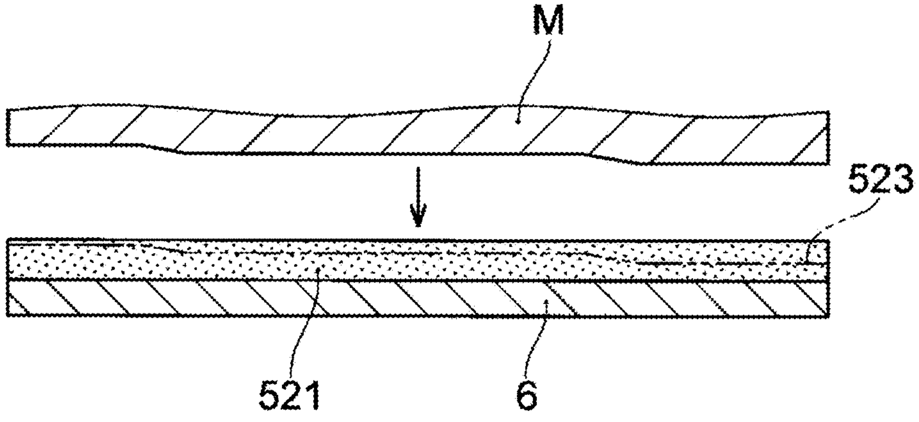
FIG. 12A is a cross-sectional view illustrating an example of a manufacturing process of an optical wiring part according to an embodiment of the present invention.

With reference to FIGS. 12A-12D, as an example of a method for forming the optical wiring part 300 illustrated in FIG. 4, a method using an imprint method is described below. As illustrated in FIG. 12A, for example, a glass plate is prepared as the support plate 6, and a lower cladding layer 521 is formed on a surface of the support plate 6. For example, a material described above as a material forming the cladding part 52 (see FIG. 12C), such as PMMA, is molded into a film and is thermocompression bonded to the support plate 6.

A mold (M) is pressed against the lower cladding layer 521. The mold (M) is provided with steps on a surface to be pressed against the lower cladding layer 521 corresponding to the steps to be provided on the surface of the core part 51 on the support plate 6 side (see FIG. 12B). By pressing the mold (M) against the support plate 6, a groove 523 for forming a core part is formed in the lower cladding layer 521. The steps corresponding to the steps to be provided on the surface of the core part 51 on the support plate 6 side are formed on a bottom surface of the groove 523.

Figure 12B:
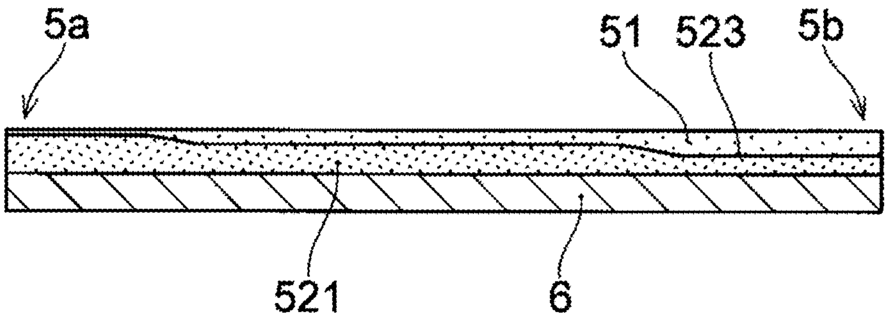
FIG. 12B is a cross-sectional view illustrating an example of a manufacturing process of an optical wiring part according to an embodiment of the present invention.

As illustrated in FIG. 12B, the groove 523 is filled with, for example, an acrylic resin or the like that forms the core part 51. As a result, the core part 51 having a smaller thickness at the first end part (5*a*) than at the second end part (5*b*) is formed in the groove 523.

Figure 12C:
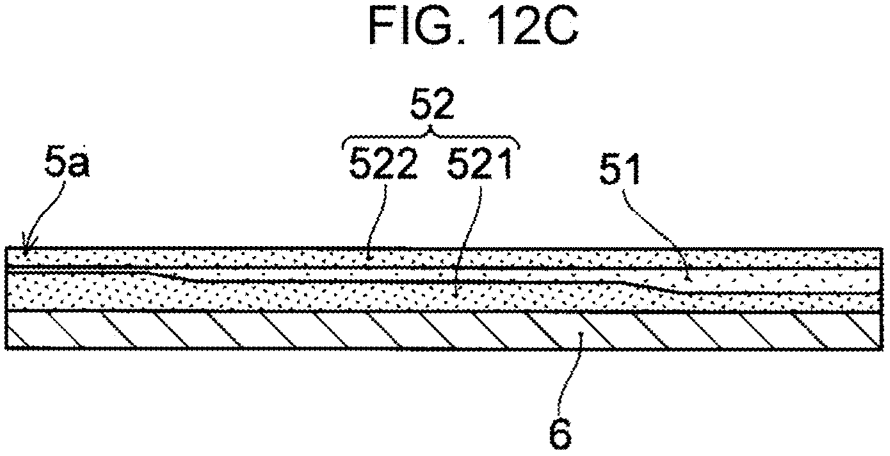
FIG. 12C is a cross-sectional view illustrating an example of a manufacturing process of an optical wiring part according to an embodiment of the present invention.

As illustrated in FIG. 12C, an upper cladding layer 522 is formed on the lower cladding layer 521 and the core part 51. For example, similar to the formation of the lower cladding layer 521, a material forming the cladding part 52, such as PMMA, is molded into a film and is thermocompression bonded to the lower cladding layer 521 and the core part 51. The cladding part 52 surrounding the core part 51 is formed by the upper cladding layer 522 being integrated with or at least in close contact with the lower cladding layer 521.

Figure 12D:
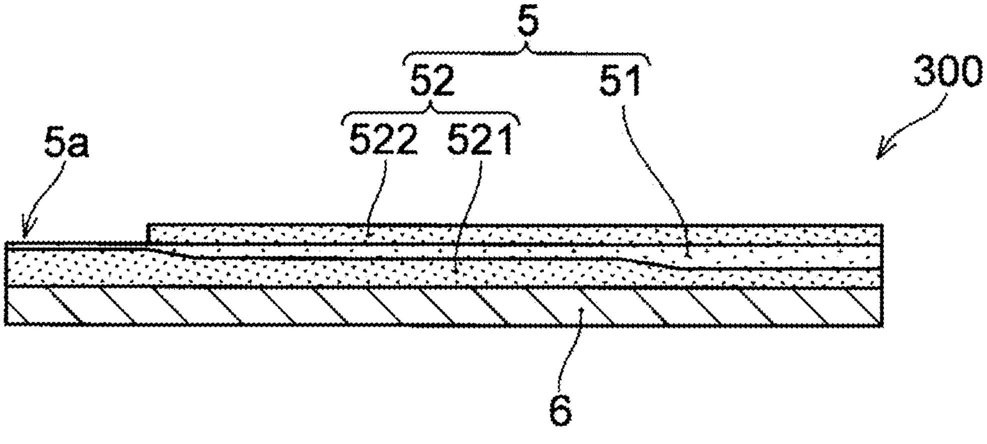
FIG. 12D is a cross-sectional view illustrating an example of a manufacturing process of an optical wiring part according to an embodiment of the present invention.

As illustrated in FIG. 12D, a portion of the upper cladding layer 522 covering the first end part (5*a*) of the core part 51 is removed. As a result, a portion of the core part 51 is exposed at the first end part (5*a*). The removed portion of the upper cladding layer 522 can be removed, for example, by exposure and development, laser processing, or the like. It is also possible that, in the process structured in FIG. 12C, the material forming the cladding part 52 is thermocompression bonded such that a portion of the core part 51 on the first end part (5*a*) side is not covered. For example, the optical wiring part 300 illustrated in FIG. 4 is formed through the processes illustrated in FIGS. 12A-12D.

Figure 13:
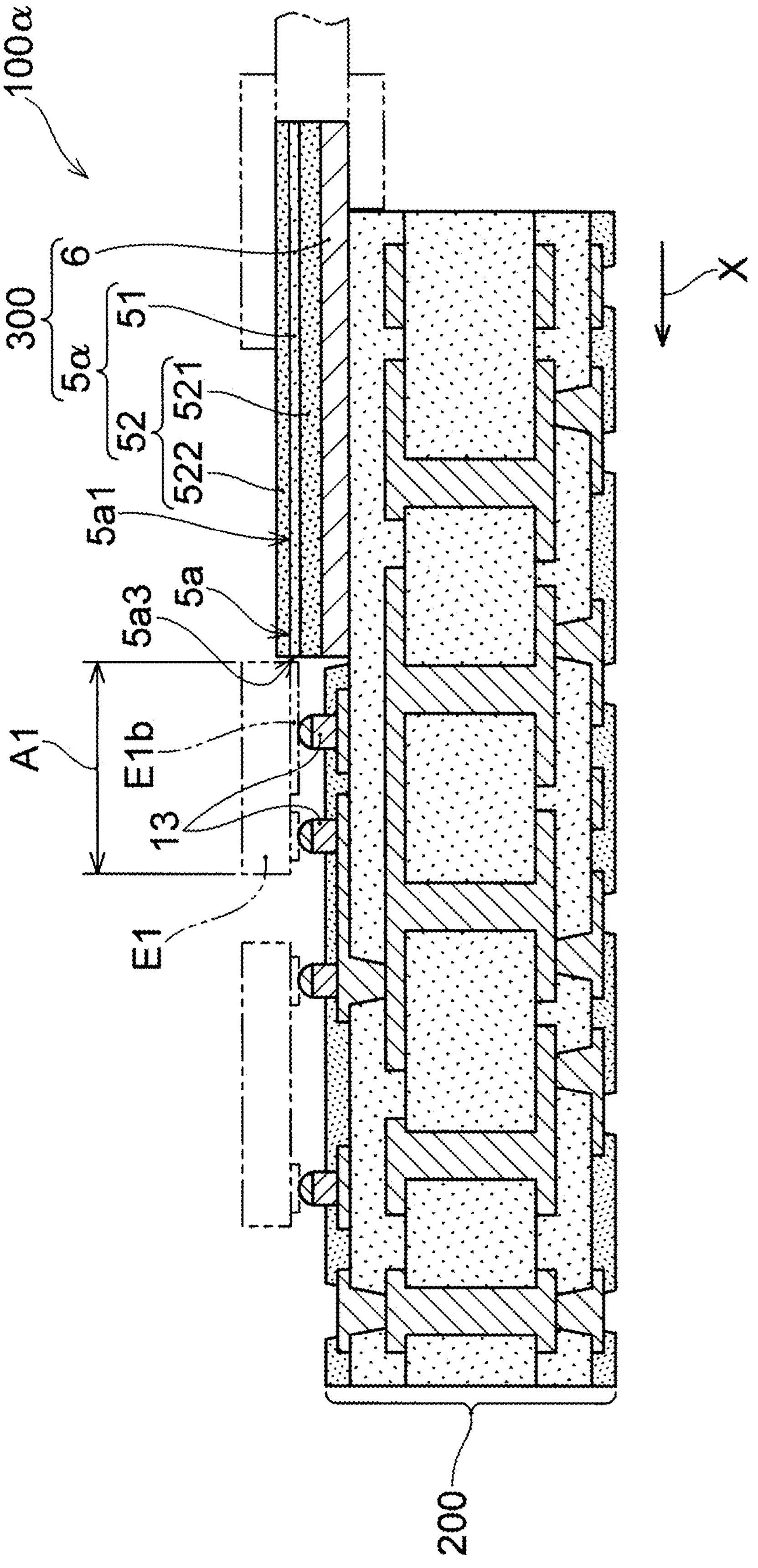
FIG. 13 is a cross-sectional view illustrating another example of an optical coupling form in a wiring substrate according to an embodiment of the present invention.

FIG. 13 illustrates a wiring substrate (100α), which is another example of the wiring substrate of the embodiment. Similar to the wiring substrate 100 illustrated in FIG. 1 and the like, the wiring substrate (100α) includes an electrical wiring part 200 and an optical wiring part 300. The optical wiring part 300 includes a support plate 6 and an optical waveguide (5α). The optical waveguide (5α) is different from the optical waveguide 5 illustrated in FIG. 1 and the like in that the end surfaces of the lower cladding layer 521 on the support plate 6 side of the core part 51, the core part 51, and the upper cladding layer 522 on the upper side of the core part 51 are flush with each other on the first end part (5*a*) side of the core part 51. Therefore, at the first end part (5*a*), the upper surface (5*a*1) of the core part 51 is not exposed, and only the end surface (5*a*3) of the core part 51 is exposed on the side surface of the optical waveguide (5α) together with the end surface of the cladding part 52. The optical waveguide (5α) is positioned to be adjacent to, without overlapping with, the component mounting region (A1) in a plan view. The optical waveguide (5α) faces the component mounting region (A1) in a direction (the X direction) along the light propagation direction in the core part 51.

The component (E1) positioned in the component mounting region (A1) is positioned on an extension line from the first end part (5*a*) of the optical waveguide (5α) and is supported by the conductor posts 13. The optical waveguide (5α) is positioned such that the end surface (5*a*3) of the core part 51 exposed on the side surface and the side surface of the light receiving or emitting part (E1*b*) of the component (E1) face each other. When the component (E1) is mounted, the end surface (5*a*3) of the core part 51 faces, and is optically coupled by butt coupling with, the side surface of the light receiving or light emitting part (E1*b*). In this way, in the wiring substrate of the embodiment, the core part 51 on the support plate 6 may be formed to face an optical element such as the component (E1) in the X direction on a lateral side of the optical element. Since the wiring substrate (100α) of FIG. 13 has substantially the same structure as the wiring substrate 100 in the example of FIG. 1 and the like except for the shape of the optical waveguide (5α) on the first end part (5*a*) side and the form of the optical coupling between the component (E1) and the optical waveguide (5α) described above, redundant descriptions about similar structures and structural elements are omitted.

The wiring substrate of the embodiment is not limited to those having the structures illustrated in the drawings and those having the structures, shapes, and materials exemplified herein. As described above, the wiring substrate of the embodiment can have any laminated structure. For example, the wiring substrate of the embodiment may be a coreless substrate that does not include a core substrate. The wiring substrate of the embodiment can include any number of conductor layers and any number of insulating layers. Further, it is also possible that the conductor pads (11*b*) and the conductor posts 14 are not formed. It is also not always necessary to provide the conductor posts 13. Further, the thickness of the core part 51 does not have to be smaller at the first end part (5*a*) than at the second end part (5*b*).

Japanese Patent Application Laid-Open Publication No. 2008-129385 describes an optical component mounting substrate, on a surface of which an optical waveguide is mounted. The optical waveguide having a core part and a cladding layer is formed on an interlayer insulating layer exposed on a surface of a wiring substrate. The optical waveguide is positioned such that an end surface of an optical fiber formed on the wiring substrate and an end surface of the core part on one end side face each other and are optically coupled with each other. Further, the optical waveguide is positioned such that the other end side of the core part is optically coupled with a light emitting part (or light receiving part) of an optical semiconductor element mounted on the wiring substrate. The entire contents of this publication are incorporated herein by reference.

In the substrate described in Japanese Patent Application Laid-Open Publication No. 2008-129385, it may be possible that the optical waveguide, which can be formed of an organic material such as a polyimide resin or an epoxy resin, cannot be appropriately positioned at a predetermined position on the wiring substrate. In this case, it may be possible that the core part of the waveguide cannot be optically coupled with sufficient efficiency with the end of the optical fiber or the light emitting part (or light receiving part) of the optical semiconductor device. Further, even when the optical waveguide is properly positioned, it may be possible that, due to expansion and contraction of an interlayer insulating layer therebelow, a positional displacement occurs between the end of the optical fiber or the light emitting part (or light receiving part) of the optical semiconductor device and the core part of the waveguide, reducing the efficiency of the optical coupling.

A wiring substrate according to an embodiment of the present invention includes: an electrical wiring part that includes insulating layers and conductor layers; and an optical wiring part that is formed on a surface of the electrical wiring part. The optical wiring part includes a support plate and an optical waveguide formed on the support plate, the optical waveguide including at least one core part that transmits light and a cladding part that surrounds the at least one core part. The support plate has a thermal expansion coefficient lower than that of the optical waveguide.

According to an embodiment of the present invention, it is thought that a positional displacement between an optical waveguide provided in the wiring substrate and an optical component optically coupled with the optical waveguide can be suppressed, coupling efficiency can be improved, or a decrease in coupling efficiency can be suppressed. Further, it is thought that a positional displacement between an optical waveguide provided in the wiring substrate and an optical fiber optically coupled with the optical waveguide can be suppressed, coupling efficiency can be improved, or a decrease in coupling efficiency can be suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:

an electrical wiring part comprising a plurality of insulating layers and a plurality of conductor layers; and an optical wiring part formed on a surface of the electrical wiring part and comprising a support plate and an optical waveguide formed on the support plate, wherein the optical wiring part is formed such that the optical waveguide includes at least one core part configured to transmit light and a cladding part surrounding the at least one core part and that the support plate has a thermal expansion coefficient that is lower than a thermal expansion coefficient of the optical waveguide, the electrical wiring part has a component mounting region configured to be covered by a component configured to optically couple with light transmitted through the optical waveguide, and the optical wiring part is formed such that the at least one core part has a first end part that overlaps with or is adjacent to the component mounting region, and a second end part on an opposite side with respect to the first end part, and is extending from the component mounting region toward an outer edge of the electrical wiring part.

2. The wiring substrate according to claim 1, wherein the electrical wiring part is formed such that the plurality of insulating layers includes an interlayer insulating layer interposed between two of the conductor layers, and the optical wiring part is formed on a portion of the interlayer insulating layer such that the portion is exposed on the surface of the electrical wiring part.

3. The wiring substrate according to claim 1, wherein the optical wiring part is formed such that the optical waveguide and the support plate have substantially a same shape and size in a plan view.

4. The wiring substrate according to claim 1, wherein the optical wiring part is formed such that the support plate has a higher bending rigidity than the optical waveguide.

5. The wiring substrate according to claim 1, wherein the optical wiring part is formed such that the second end part and a portion of the cladding part surrounding the second end part are protruding to an outer side of the electrical wiring part.

6. The wiring substrate according to claim 5, wherein the optical wiring part is formed such that a portion of the support plate is protruding to the outer side of the electrical wiring part together with the second end part of the at least one core part.

7. The wiring substrate according to claim 1, wherein the optical wiring part is formed such that the optical waveguide includes an organic substance.

8. The wiring substrate according to claim 1, wherein the support plate includes one of glass, ceramics, and metal.

9. The wiring substrate according to claim 1, wherein the optical wiring part is formed such that the at least one core part of the optical waveguide comprises a plurality of core parts and that the cladding part is divided into a plurality of cladding parts surrounding the plurality of core parts, respectively.

10. The wiring substrate according to claim 3, wherein the optical wiring part is formed such that the support plate has a higher bending rigidity than the optical waveguide.

11. The wiring substrate according to claim 1, wherein the optical wiring part is formed such that a surface of the at least one core part on an opposite side with respect to the support plate is exposed from the cladding part at the first end part.

12. The wiring substrate according to claim 1, wherein the optical wiring part is formed such that a thickness of the at least one core part at the first end part is smaller than a thickness of the at least one core part at the second end part.

13. The wiring substrate according to claim 12, wherein the optical wiring part is formed such that the at least one core part is integrally formed from the first end part to the second end part.

14. The wiring substrate according to claim 12, wherein the optical wiring part is formed such that a distance from an interface between a surface of the at least one core part on the support plate side and the cladding part to the support plate varies between the first end part and the second end part or that a distance from an interface between a surface of the at least one core part on an opposite side with respect to the support plate side and the cladding part to the support plate varies between the first end part and the second end part.

15. The wiring substrate according to claim 12, wherein the optical wiring part is formed such that the thickness of the at least one core part decreases stepwise from an end surface on the second end part side to an end surface on the first end part side.

16. The wiring substrate according to claim 12, wherein the optical wiring part is formed such that the thickness of the at least one core part continuously decreases from an end surface on the second end part side to an end surface on the first end part side.

17. The wiring substrate according to claim 2, wherein the optical wiring part is formed such that the optical waveguide and the support plate have substantially a same shape and size in a plan view.

18. The wiring substrate according to claim 2, wherein the optical wiring part is formed such that the support plate has a higher bending rigidity than the optical waveguide.

19. The wiring substrate according to claim 2, wherein the optical wiring part is formed such that the second end part and a portion of the cladding part surrounding the second end part are protruding to an outer side of the electrical wiring part.

20. The wiring substrate according to claim 19, wherein the optical wiring part is formed such that a portion of the support plate is protruding to the outer side of the electrical wiring part together with the second end part of the at least one core part.

* * * * *